(12) United States Patent
Meitl et al.

(10) Patent No.: US 10,777,521 B2
(45) Date of Patent: Sep. 15, 2020

(54) PRINTABLE COMPONENT STRUCTURE WITH ELECTRICAL CONTACT

(71) Applicant: X Display Company Technology Limited, Dublin (IE)

(72) Inventors: Matthew Meitl, Durham, NC (US); Christopher Bower, Raleigh, NC (US); Ronald S. Cok, Rochester, NY (US)

(73) Assignee: X Display Company Technology Limited, Dublin (IE)

( * ) Notice: Subject to any disclaimer, the term of this patent is extended or adjusted under 35 U.S.C. 154(b) by 0 days.

(21) Appl. No.: 14/823,917

(22) Filed: Aug. 11, 2015

(65) Prior Publication Data
US 2017/0047303 A1 Feb. 16, 2017

(51) Int. Cl.
*H01L 23/00* (2006.01)
*H05K 1/11* (2006.01)
(Continued)

(52) U.S. Cl.
CPC ............ *H01L 24/11* (2013.01); *H01L 24/08* (2013.01); *H01L 24/13* (2013.01); *H01L 24/14* (2013.01); *H01L 24/17* (2013.01); *H05K 1/112* (2013.01); *H05K 3/3436* (2013.01); *H01L 2224/1144* (2013.01); *H01L 2224/11466* (2013.01); *H01L 2224/13017* (2013.01); *H01L 2224/13023* (2013.01); *H01L 2224/1357* (2013.01); *H01L 2224/1403* (2013.01); *H01L 2224/1412* (2013.01); *H01L 2224/1418* (2013.01);
(Continued)

(58) Field of Classification Search
None
See application file for complete search history.

(56) References Cited

U.S. PATENT DOCUMENTS 4,934,267 A 6/1990 Hashimoto et al.
5,388,577 A 2/1995 Hubbard
(Continued)

FOREIGN PATENT DOCUMENTS

EP 0281100 B1 6/1992
JP H11-142878 A 5/1999
(Continued)

OTHER PUBLICATIONS

Hamer, John W., et al. "63.2: AMOLED Displays Using Transfer—Printed Integrated Circuits." SID Symposium Digest of Technical Papers. vol. 40. No. 1. Blackwell Publishing Ltd, 2009.*
(Continued)

*Primary Examiner* — Nicholas J Tobergte
*Assistant Examiner* — Kien C Ly
(74) *Attorney, Agent, or Firm* — William R. Haulbrook; Michael D. Schmiff; Choate, Hall & Stewart LLP

(57) ABSTRACT

A printable component structure includes a chiplet having a semiconductor structure with a top side and a bottom side, one or more top electrical contacts on the top side of the semiconductor structure, and one or more bottom electrical contacts on the bottom side of the semiconductor structure. One or more electrically conductive spikes are in electrical contact with the one or more top electrical contacts. Each spike protrudes from the top side of the semiconductor structure or a layer in contact with the top side of the semiconductor structure.

16 Claims, 17 Drawing Sheets

(51) Int. Cl.
 *H05K 3/34* (2006.01)
 *H05K 3/30* (2006.01)

(52) U.S. Cl.
 CPC ........ H01L 2224/1624 (2013.01); H01L 2224/16227 (2013.01); H01L 2224/17107 (2013.01); H01L 2924/12041 (2013.01); H01L 2924/12043 (2013.01); H01L 2924/12044 (2013.01); H01L 2924/1304 (2013.01); H05K 3/305 (2013.01); H05K 2201/0979 (2013.01); H05K 2201/09409 (2013.01); H05K 2201/09472 (2013.01); H05K 2201/10143 (2013.01)

(56) References Cited

U.S. PATENT DOCUMENTS

| | | |
|---|---|---|
| 5,550,066 A | 8/1996 | Tang et al. |
| 5,557,149 A | 9/1996 | Richards et al. |
| 5,621,555 A | 4/1997 | Park |
| 5,815,303 A | 9/1998 | Berlin |
| 5,929,521 A | 7/1999 | Wark et al. |
| 6,025,730 A | 2/2000 | Akram et al. |
| 6,051,489 A | 4/2000 | Young et al. |
| 6,114,221 A * | 9/2000 | Tonti ............ H01L 21/76898 257/686 |
| 6,142,358 A | 11/2000 | Cohn et al. |
| 6,180,239 B1 | 1/2001 | Whitesides et al. |
| 6,277,669 B1 | 8/2001 | Kung et al. |
| 6,278,242 B1 | 8/2001 | Cok et al. |
| 6,400,021 B1 | 6/2002 | Cho |
| 6,448,108 B1 | 9/2002 | Lin |
| 6,544,813 B1 | 4/2003 | Lin |
| 6,555,408 B1 | 4/2003 | Jacobsen et al. |
| 6,577,367 B2 | 6/2003 | Kim |
| 6,717,263 B2 | 4/2004 | Sawai et al. |
| 6,717,560 B2 | 4/2004 | Cok et al. |
| 6,756,576 B1 | 6/2004 | McElroy et al. |
| 6,841,853 B2 | 1/2005 | Yamada |
| 6,933,532 B2 | 8/2005 | Arnold et al. |
| 6,964,881 B2 | 11/2005 | Chua et al. |
| 6,969,624 B2 | 11/2005 | Iwafuchi et al. |
| 6,974,711 B2 | 12/2005 | Yanagisawa et al. |
| 6,998,644 B1 | 2/2006 | Boling et al. |
| 7,109,063 B2 | 9/2006 | Jiang |
| 7,115,495 B2 | 10/2006 | Wark et al. |
| 7,127,810 B2 | 10/2006 | Kasuga et al. |
| 7,129,457 B2 | 10/2006 | McElroy et al. |
| 7,195,733 B2 | 3/2007 | Rogers et al. |
| 7,259,391 B2 | 8/2007 | Liu et al. |
| 7,288,753 B2 | 10/2007 | Cok |
| 7,380,007 B1 | 5/2008 | Bu et al. |
| 7,453,157 B2 | 11/2008 | Haba et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,622,367 B1 | 11/2009 | Nuzzo et al. |
| 7,635,611 B2 | 12/2009 | Jiang |
| 7,662,545 B2 | 2/2010 | Nuzzo et al. |
| 7,667,335 B2 | 2/2010 | Lin et al. |
| 7,691,656 B2 | 4/2010 | Bader et al. |
| 7,704,684 B2 | 4/2010 | Rogers et al. |
| 7,749,887 B2 | 7/2010 | Lee |
| 7,799,699 B2 | 9/2010 | Nuzzo et al. |
| 7,816,856 B2 | 10/2010 | Cok et al. |
| 7,893,533 B2 | 2/2011 | Saito |
| 7,893,612 B2 | 2/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,977,789 B2 | 7/2011 | Park |
| 7,982,296 B2 | 7/2011 | Nuzzo et al. |
| 7,999,454 B2 | 8/2011 | Winters et al. |
| 8,008,182 B2 | 8/2011 | Asakawa |
| 8,029,139 B2 | 10/2011 | Ellinger et al. |
| 8,035,226 B1 | 10/2011 | Wilcoxen et al. |
| 8,039,847 B2 | 10/2011 | Nuzzo et al. |
| 8,110,425 B2 | 2/2012 | Yun |
| 8,198,621 B2 | 6/2012 | Rogers et al. |
| 8,207,547 B2 | 6/2012 | Lin |
| 8,261,660 B2 | 9/2012 | Menard |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,449,285 B2 | 5/2013 | McGeehan |
| 8,470,701 B2 | 6/2013 | Rogers et al. |
| 8,502,192 B2 | 8/2013 | Kwak et al. |
| 8,506,867 B2 | 8/2013 | Menard |
| 8,558,243 B2 | 10/2013 | Bibl et al. |
| 8,664,699 B2 | 3/2014 | Nuzzo et al. |
| 8,669,173 B2 | 3/2014 | Lee |
| 8,685,764 B2 | 4/2014 | Chu et al. |
| 8,686,447 B2 | 4/2014 | Tomoda et al. |
| 8,722,458 B2 | 5/2014 | Rogers et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,809,672 B2 * | 8/2014 | Chuang ............ H01L 31/0304 136/255 |
| 8,817,369 B2 | 8/2014 | Daiku |
| 8,835,940 B2 | 9/2014 | Hu et al. |
| 8,854,294 B2 | 10/2014 | Sakariya |
| 8,865,489 B2 | 10/2014 | Rogers et al. |
| 8,871,547 B2 | 10/2014 | Chu et al. |
| 8,877,648 B2 | 11/2014 | Bower et al. |
| 8,889,485 B2 | 11/2014 | Bower |
| 8,890,315 B2 | 11/2014 | Choi et al. |
| 8,895,406 B2 | 11/2014 | Rogers et al. |
| 8,934,259 B2 | 1/2015 | Bower et al. |
| 8,941,215 B2 | 1/2015 | Hu et al. |
| 8,963,326 B2 | 2/2015 | Bao et al. |
| 8,987,765 B2 | 3/2015 | Bibl et al. |
| 9,082,910 B2 * | 7/2015 | Lee .................. H01L 31/0236 |
| 9,105,714 B2 | 8/2015 | Hu et al. |
| 9,153,171 B2 | 10/2015 | Sakariya et al. |
| 9,161,448 B2 | 10/2015 | Menard et al. |
| 9,214,410 B2 | 12/2015 | Kim et al. |
| 9,217,541 B2 | 12/2015 | Bathurst et al. |
| 9,224,680 B2 | 12/2015 | Chen et al. |
| 9,238,309 B2 | 1/2016 | King et al. |
| 9,252,094 B2 | 2/2016 | Choi et al. |
| 9,307,652 B2 | 4/2016 | Bower |
| 9,358,775 B2 | 6/2016 | Bower et al. |
| 9,367,094 B2 | 6/2016 | Bibl et al. |
| 9,368,683 B1 | 6/2016 | Meitl et al. |
| 9,401,344 B2 | 7/2016 | Bower et al. |
| 9,478,583 B2 | 10/2016 | Hu et al. |
| 9,484,504 B2 | 11/2016 | Bibl et al. |
| 9,508,666 B2 | 11/2016 | Yu et al. |
| 9,520,537 B2 | 12/2016 | Bower et al. |
| 9,550,353 B2 | 1/2017 | Bower et al. |
| 9,555,644 B2 | 1/2017 | Rogers et al. |
| 9,583,533 B2 | 2/2017 | Hu et al. |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,865,832 B2 | 1/2018 | Bibl et al. |
| 9,929,053 B2 | 3/2018 | Bower et al. |
| 2001/0003296 A1 | 6/2001 | Morimoto et al. |
| 2001/0033030 A1 | 10/2001 | Leedy |
| 2001/0040298 A1 | 11/2001 | Baba et al. |
| 2002/0050220 A1 | 5/2002 | Schueller et al. |
| 2003/0017712 A1 | 1/2003 | Brendel |
| 2003/0027083 A1 | 2/2003 | Fuller et al. |
| 2003/0183947 A1 * | 10/2003 | Ohuchi ............ H01L 21/56 257/778 |
| 2003/0222353 A1 | 12/2003 | Yamada |
| 2004/0192041 A1 | 9/2004 | Jeong et al. |
| 2004/0259290 A1 | 12/2004 | Brintzinger et al. |

(56) References Cited

U.S. PATENT DOCUMENTS

| | | |
|---|---|---|
| 2005/0181655 A1 | 8/2005 | Haba et al. |
| 2005/0202595 A1 | 9/2005 | Yonehara et al. |
| 2005/0285246 A1 | 12/2005 | Haba et al. |
| 2006/0051900 A1 | 3/2006 | Shizuno |
| 2006/0063309 A1 | 3/2006 | Sugiyama et al. |
| 2007/0018321 A1 | 1/2007 | Hiatt et al. |
| 2007/0075423 A1 | 4/2007 | Ke et al. |
| 2007/0080464 A1* | 4/2007 | Goebel .................. H01L 24/03 257/774 |
| 2007/0085102 A1* | 4/2007 | Orita ...................... B82Y 20/00 257/98 |
| 2007/0088906 A1* | 4/2007 | Mizushima ........... G06F 21/602 711/103 |
| 2007/0120268 A1 | 5/2007 | Irsigler et al. |
| 2007/0145550 A1 | 6/2007 | Haba et al. |
| 2008/0067663 A1 | 3/2008 | Kang et al. |
| 2008/0108171 A1 | 5/2008 | Rogers et al. |
| 2008/0111146 A1* | 5/2008 | Nakamura .............. H01L 33/60 257/98 |
| 2008/0131822 A1 | 6/2008 | Liao et al. |
| 2008/0150121 A1 | 6/2008 | Oganesian et al. |
| 2008/0164575 A1* | 7/2008 | Ikeda ................ H01L 21/76898 257/622 |
| 2008/0185705 A1* | 8/2008 | Osborn ............. H01L 23/49811 257/690 |
| 2008/0202365 A1 | 8/2008 | Schneider et al. |
| 2009/0014205 A1 | 1/2009 | Kobayashi et al. |
| 2009/0065773 A1* | 3/2009 | Ishikawa .............. H01L 25/105 257/48 |
| 2009/0133914 A1 | 5/2009 | Dellmann et al. |
| 2009/0146303 A1 | 6/2009 | Kwon |
| 2009/0199960 A1* | 8/2009 | Nuzzo .................... B82Y 10/00 156/230 |
| 2009/0229861 A1 | 9/2009 | Hando et al. |
| 2009/0283903 A1 | 11/2009 | Park |
| 2009/0301771 A1* | 12/2009 | Ochi ........................ H01L 24/11 174/260 |
| 2010/0006876 A1* | 1/2010 | Moteki ................... H01L 33/20 257/95 |
| 2010/0044826 A1 | 2/2010 | Farooq et al. |
| 2010/0062098 A1 | 3/2010 | Ando et al. |
| 2010/0096175 A1 | 4/2010 | Ishimatsu et al. |
| 2010/0123134 A1 | 5/2010 | Nagata |
| 2010/0123268 A1* | 5/2010 | Menard ............... H01L 21/6835 264/293 |
| 2010/0147567 A1 | 6/2010 | Hino et al. |
| 2010/0155989 A1 | 6/2010 | Ishii et al. |
| 2010/0190293 A1 | 7/2010 | Maeda et al. |
| 2010/0248484 A1 | 9/2010 | Bower et al. |
| 2010/0265440 A1 | 10/2010 | French et al. |
| 2010/0289115 A1 | 11/2010 | Akiyama et al. |
| 2010/0308008 A1 | 12/2010 | Zhu et al. |
| 2011/0140271 A1 | 6/2011 | Daubenspeck et al. |
| 2011/0182805 A1 | 7/2011 | DeSimone et al. |
| 2011/0219973 A1 | 9/2011 | Gullentops et al. |
| 2011/0266670 A1* | 11/2011 | England ................ H01L 23/562 257/738 |
| 2012/0000379 A1 | 1/2012 | Greener et al. |
| 2012/0043130 A1* | 2/2012 | Rathburn ........... H01R 13/2414 174/266 |
| 2012/0074532 A1 | 3/2012 | Shih et al. |
| 2012/0104624 A1* | 5/2012 | Choi ..................... H01L 21/561 257/774 |
| 2012/0118939 A1 | 5/2012 | Kusanagi et al. |
| 2012/0126229 A1 | 5/2012 | Bower |
| 2012/0168776 A1 | 7/2012 | Nakamura et al. |
| 2012/0206421 A1 | 8/2012 | Cok et al. |
| 2012/0228669 A1 | 9/2012 | Bower et al. |
| 2012/0256346 A1 | 10/2012 | Ogino et al. |
| 2012/0281379 A1* | 11/2012 | Shimada ............... H01L 21/486 361/782 |
| 2012/0306073 A1 | 12/2012 | Yu et al. |
| 2012/0313207 A1 | 12/2012 | Oganesian |
| 2012/0313241 A1 | 12/2012 | Bower |
| 2012/0314388 A1 | 12/2012 | Bower et al. |
| 2012/0321738 A1 | 12/2012 | Ishii et al. |
| 2012/0328728 A1 | 12/2012 | Nakatsuka et al. |
| 2013/0068720 A1 | 3/2013 | Taniguchi |
| 2013/0069275 A1 | 3/2013 | Menard et al. |
| 2013/0077272 A1 | 3/2013 | Lin et al. |
| 2013/0078576 A1 | 3/2013 | Wu et al. |
| 2013/0088416 A1 | 4/2013 | Smith et al. |
| 2013/0119536 A1 | 5/2013 | Hada et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0228897 A1 | 9/2013 | Chen et al. |
| 2013/0273695 A1 | 10/2013 | Menard et al. |
| 2013/0293292 A1 | 11/2013 | Droege et al. |
| 2013/0333094 A1 | 12/2013 | Rogers et al. |
| 2013/0337608 A1 | 12/2013 | Kotani et al. |
| 2014/0015124 A1 | 1/2014 | Fay et al. |
| 2014/0084450 A1 | 3/2014 | Nielson et al. |
| 2014/0094878 A1 | 4/2014 | Gossler et al. |
| 2014/0104243 A1 | 4/2014 | Sakariya et al. |
| 2014/0159043 A1 | 6/2014 | Sakariya et al. |
| 2014/0159064 A1 | 6/2014 | Sakariya et al. |
| 2014/0159065 A1 | 6/2014 | Hu et al. |
| 2014/0182912 A1 | 7/2014 | Lin et al. |
| 2014/0252604 A1* | 9/2014 | Motoyoshi .............. H01L 24/11 257/737 |
| 2014/0264763 A1 | 9/2014 | Meitl et al. |
| 2014/0267683 A1 | 9/2014 | Bibl et al. |
| 2014/0327132 A1* | 11/2014 | Zhang ..................... H01L 24/11 257/737 |
| 2014/0367633 A1 | 12/2014 | Bibl et al. |
| 2015/0028473 A1* | 1/2015 | Kim ...................... H01L 23/481 257/737 |
| 2015/0102807 A1* | 4/2015 | Eckinger ............... G01R 33/072 324/251 |
| 2015/0135525 A1 | 5/2015 | Bower |
| 2015/0137153 A1 | 5/2015 | Bibl et al. |
| 2015/0163906 A1 | 6/2015 | Bower et al. |
| 2015/0348926 A1 | 12/2015 | Bower |
| 2015/0371874 A1 | 12/2015 | Bower et al. |
| 2016/0016399 A1 | 1/2016 | Bower et al. |
| 2016/0018094 A1 | 1/2016 | Bower et al. |
| 2016/0020120 A1 | 1/2016 | Bower et al. |
| 2016/0020127 A1 | 1/2016 | Bower et al. |
| 2016/0020130 A1 | 1/2016 | Bower et al. |
| 2016/0020131 A1 | 1/2016 | Bower et al. |
| 2016/0020187 A1* | 1/2016 | Okada ................. H01L 23/3121 257/737 |
| 2016/0056223 A1 | 2/2016 | Bower et al. |
| 2016/0093600 A1 | 3/2016 | Bower et al. |
| 2016/0111387 A1* | 4/2016 | Dang ..................... H01L 24/17 257/737 |
| 2016/0262268 A1* | 9/2016 | Co ..................... B29C 45/14754 |
| 2017/0047306 A1 | 2/2017 | Meitl et al. |
| 2017/0048976 A1 | 2/2017 | Prevatte et al. |
| 2017/0154819 A1 | 6/2017 | Bower et al. |
| 2017/0213803 A1 | 7/2017 | Bower |
| 2017/0287789 A1 | 10/2017 | Bower et al. |
| 2017/0338374 A1 | 11/2017 | Zou et al. |
| 2018/0031974 A1 | 2/2018 | Prevatte et al. |
| 2018/0042110 A1 | 2/2018 | Cok |
| 2018/0090394 A1 | 3/2018 | Bower et al. |

FOREIGN PATENT DOCUMENTS

| | | |
|---|---|---|
| JP | 2005 099410 A | 4/2005 |
| WO | WO-2008/103931 A2 | 8/2008 |
| WO | WO-2016/012409 A2 | 1/2016 |
| WO | WO-2017/167954 A2 | 10/2017 |

OTHER PUBLICATIONS

Kim, S. et al, Microstructural elastomeric surfaces with reversible adhesion and examples of their use in deterministic assembly by transfer printing, PNAS, 107(40):17095-17100 (2010).

(56) References Cited

OTHER PUBLICATIONS

Hamer et al., 63.2: AMOLED Displays Using Transfer-Printed Integrated Circuits, SID 09 Digest, 947-950 (2009).

Roscher, H., VCSEL Arrays with Redundant Pixel Designs for 10Gbits/s 2-D Space-Parallel MMF Transmission, Annual Report, optoelectronics Department, (2005).

Yaniv et al., A 640 x 480 Pixel Computer Display Using Pin Diodes with Device Redundancy, 1988 International Display Research Conference, IEEE, CH-2678-1/88:152-154 (1988).

Bower, C. A. et al., Transfer Printing: An Approach for Massively Parallel Assembly of Microscale Devices, IEE, Electronic Components and Technology Conference, 2008, pp. 1105-1109.

Foest, R. et al., Kalte Normaldruck-Jetplasmen zur lokalen Oberflächenbehandlung, Vakuum in Forschung and Praxis, 21(6):17-21, (2009).

Howlader, M. M. R. et al., Nanobonding Technology Toward Electronic, Fluidic, and Photonic Systems Integration, IEEE, Journal of Selected Topics in Quantum Electronics, 17(3):689-703, (2011).

Cok, R. S. et al., AMOLED Displays Using Transfer-Printed Integrated Circuits, Society for Information Display, 10:902-904 (2010).

Cok, R. S. et al., AMOLED displays with transfer-printed integrated circuits, Journal of SID, 19(4):335-341 (2011).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

* cited by examiner

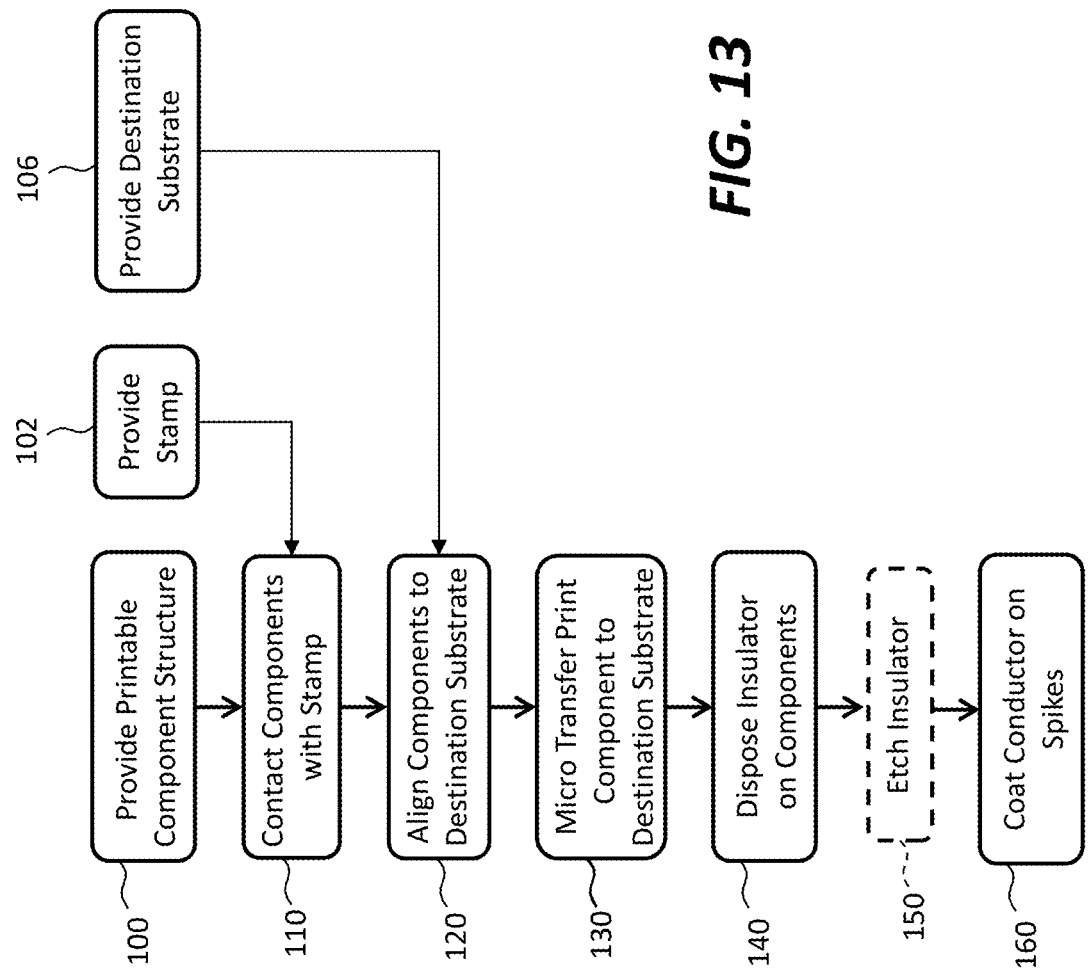

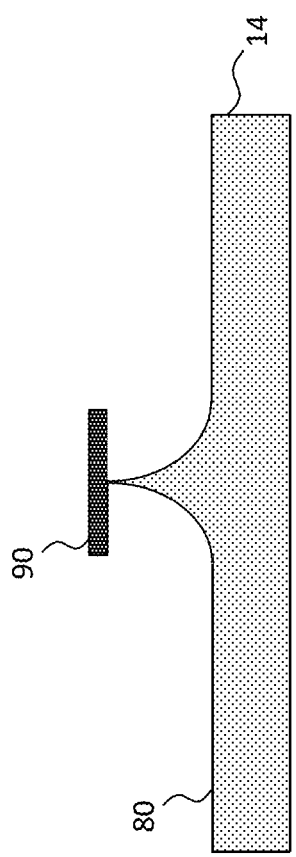
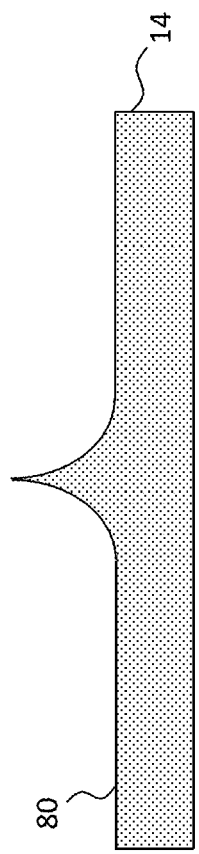
FIG. 18
FIG. 19

PRINTABLE COMPONENT STRUCTURE WITH ELECTRICAL CONTACT

CROSS REFERENCE TO RELATED APPLICATION

Reference is made to U.S. Pat. No. 8,889,485, entitled Methods for Surface Attachment of Flipped Active Components by Christopher Bower, and to U.S. patent application Ser. No. 14/822,864, filed Aug. 10, 2015 and entitled Chiplets with Connection Posts by Prevatte et al, the disclosures of which are incorporated herein by reference in their entirety.

FIELD OF THE INVENTION

The present invention relates to structures and methods for electrically interconnecting chiplets using micro transfer printing.

BACKGROUND OF THE INVENTION

Substrates with electronically active components distributed over the extent of the substrate may be used in a variety of electronic systems, including flat-panel imaging devices, such as flat-panel liquid crystal or organic light emitting diode (OLED) display devices, and flat-panel solar cells. A variety of methods may be used to distribute electronically active circuits over substrates, including forming the electronically active circuits on a substrate and forming the components on separate substrates and placing them on a substrate. In the latter case, a variety of assembly technologies for device packaging may be used.

The electronically active components are typically formed on a substrate by sputtering a layer of inorganic semiconductor material or by spin-coating organic material over the entire substrate. Inorganic semiconductor materials can be processed to improve their electronic characteristics, for example amorphous silicon can be treated to form low-temperature or high-temperature poly-crystalline silicon. In other process methods, microcrystalline semiconductor layers can be formed by using an underlying seeding layer. These methods typically improve the electron mobility of the semiconductor layer. The substrate and layer of semiconductor material can be photo-lithographically processed to define electronically active components, such as transistors. Such transistors are known as thin-film transistors (TFTs) since they are formed in a thin layer of semiconductor material, typically silicon. Transistors may also be formed in thin layers of organic materials. In these devices, the substrate is often made of glass, for example Corning Eagle® or Jade® glass designed for display applications.

The above techniques have some limitations. Despite processing methods used to improve the performance of thin-film transistors, such transistors may provide performance that is lower than the performance of other integrated circuits formed in mono-crystalline semiconductor material. Semiconductor material and active components can be provided only on portions of the substrate, leading to wasted material and increased material and processing costs. The choice of substrate materials can also be limited by the processing steps necessary to process the semiconductor material and the photo-lithographic steps used to pattern the active components. For example, plastic substrates have a limited chemical and heat tolerance and do not readily survive photo-lithographic processing. Furthermore, the manufacturing equipment used to process large substrates with thin-film circuitry is relatively expensive. Other substrate materials that may be used include quartz, for example, for integrated circuits using silicon-on-insulator structures as described in U.S. Patent Application 2010/0289115 and U.S. Patent Application 2010/0123134. However, such substrate materials can be more expensive or difficult to process.

Other methods used for distributing electronically functional components over a substrate in the circuit board assembly industry include pick-and-place technologies for integrated circuits provided in a variety of packages, such as pin-grid arrays, ball-grid arrays, and flip-chips. However, these techniques may be limited in the size of the integrated circuits that can be placed.

In further manufacturing techniques, a mono-crystalline semiconductor wafer is employed as the substrate. While this approach can provide substrates with the same performance as integrated circuits, the size of such substrates may be limited, for example, to a 12-inch diameter circle, and the wafers are relatively expensive compared to other substrate materials such as glass, polymer, or quartz.

In yet another approach, thin layers of semiconductor are bonded to a substrate and then processed. Such a method is known as semiconductor-on-glass or silicon-on-glass (SOG) and is described, for example, in U.S. Pat. No. 7,605,053, issued Oct. 20, 2009. If the semiconductor material is crystalline, high-performance thin-film circuits can be obtained. However, the bonding technique and the processing equipment for the substrates to form the thin-film active components on large substrates can be relatively expensive.

Publication No. 11-142878 of the Patent Abstracts of Japan entitled Formation of Display Transistor Array Panel describes etching a substrate to remove it from a thin-film transistor array on which the TFT array was formed. TFT circuits formed on a first substrate can be transferred to a second substrate by adhering the first substrate and the TFTs to the surface of the second substrate and then etching away the first substrate, leaving the TFTs bonded to the second substrate. This method may require etching a significant quantity of material, and may risk damaging the exposed TFT array.

Other methods of locating material on a substrate are described in U.S. Pat. No. 7,127,810. In this approach, a first substrate carries a thin-film object to be transferred to a second substrate. An adhesive is applied to the object to be transferred or to the second substrate in the desired location of the object. The substrates are aligned and brought into contact. A laser beam irradiates the object to abrade the transferring thin film so that the transferring thin film adheres to the second substrate. The first and second substrates are separated, peeling the film in the abraded areas from the first substrate and transferring it to the second substrate. In one embodiment, a plurality of objects is selectively transferred by employing a plurality of laser beams to abrade selected area. Objects to be transferred can include thin-film circuits.

U.S. Pat. No. 6,969,624 describes a method of transferring a device from a first substrate onto a holding substrate by selectively irradiating an interface with an energy beam. The interface is located between a device for transfer and the first substrate and includes a material that generates ablation upon irradiation, thereby releasing the device from the substrate. For example, a light-emitting device (LED) is made of a nitride semiconductor on a sapphire substrate. The energy beam is directed to the interface between the sapphire substrate and the nitride semiconductor releasing the LED and allowing the LED to adhere to a holding substrate coated with an adhesive. The adhesive is then cured. These methods, however, may require the patterned deposition of adhesive on the object(s) or on the second substrate. Moreover, the laser beam that irradiates the object may need to be shaped to match the shape of the object, and the laser abrasion can damage the object to be transferred. Furthermore, the adhesive cure takes time, which may reduce the throughput of the manufacturing system.

Another method for transferring active components from one substrate to another is described in *AMOLED Displays using Transfer-Printed Integrated Circuits* published in the Proceedings of the 2009 Society for Information Display International Symposium Jun. 2-5, 2009, in San Antonio Tex., US, vol. 40, Book 2, ISSN 0009-0966X, paper 63.2 p. 947. In this approach, small integrated circuits are formed over a buried oxide layer on the process side of a crystalline wafer. The small integrated circuits, or chiplets, are released from the wafer by etching the buried oxide layer formed beneath the circuits. A PDMS stamp is pressed against the wafer and the process side of the chiplets is adhered to the stamp. The chiplets are pressed against a destination substrate or backplane coated with an adhesive and thereby adhered to the destination substrate. The adhesive is subsequently cured. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In such methods it is generally necessary to electrically connect the small integrated circuits or chiplets to electrically conductive elements such as backplane contact pads on the destination substrate. By applying electrical signals to conductors on the destination substrate the small integrated circuits are energized and made operational. The electrical connections between the small integrated circuits and the backplane contact pads are typically made by photolithographic processes in which a metal is evaporated or sputtered onto the small integrated circuits and the destination substrate to form a metal layer, the metal layer is coated with a photoresist that is exposed to a circuit connection pattern, and the metal layer and photoresist are developed by etching and washing to form the patterned electrical connections between the small integrated circuits and the connection pads on the destination substrate. Furthermore, in conventional processes, a common electrical connection to all of the components on a backplane (for example a common ground connection) is made by first forming an insulator such as a dielectric layer. A contact to the component is then opened by etching a photolithographically exposed mask and a conductor applied. Additional layers, such as interlayer dielectric insulators can also be required. These processes are expensive and require a number of manufacturing steps. Moreover, the topographical structure of the small integrated circuits over the destination substrate renders the electrical connections problematic, for example it can be difficult to form a continuous conductor from the destination substrate to the small integrated circuit because of the differences in height over the surface between the small integrated circuits and the destination substrate.

There is a need, therefore, for structures and methods that enable the electrical interconnection of small integrated circuits, such as micro transfer printed chiplets, to destination substrates.

SUMMARY OF THE INVENTION

In accordance with embodiments of the present invention, components such as chiplets incorporating active elements (e.g., transistors) and passive elements (e.g., resistors, capacitors, and conductors) are micro transfer printed from a native source wafer to a non-native destination substrate or backplane. In certain embodiments, the components each include a semiconductor structure with electrical contacts on each of a top side and a bottom side. One or more electrically conductive spikes are in electrical contact with the one or more top electrical contacts (e.g., one spike per contact or two or more spikes per contact) and protrudes from the top side of the semiconductor structure or a layer in contact with the top side of the semiconductor. The spikes can be used to form electrical connections between a plurality of components without requiring high-resolution photolithography.

In conventional processes, a component on a backplane is first insulated with an insulator such as a dielectric layer. A contact on the component is opened by etching a photolithographically exposed mask and then a conductor applied. By providing a spike as on the top of the component, the high-resolution photolithographic step of opening a contact to the component is avoided, saving cost and materials. According to embodiments of the present invention, when a dielectric layer is provided over the components, the insulator can either be provided in such a quantity or in such a way that the spike is exposed. Alternatively, a blanket etch of the insulator can expose the spike without needing a pattern etch. A subsequently deposited conductor, for example covering a plurality of components, can electrically connect the spikes and the components, for example with ground plane or power plane.

In another embodiment of the present invention, two or more electrically connected spikes are provided to electrically contact a common conductor. By providing two or more spikes in electrical contact with a common conductor, faults in electrical connections between the component and the conductor are reduced by providing a redundant electrical connection from the component to the conductor.

According to a further embodiment of the present invention, a stamp having pillars with a structured pillar surface at an end of the pillar opposite the body is used to micro transfer print the printable component structures. The structure pillar surface is formed to complement the topography of the printable component structures, for example having recesses where spikes extend from the printable component structure surface or having a surface that conforms to the topography of the printable component structure. Such a stamp can be made by using the printable component structure itself as an element of the mold at the end of the pillars.

Because the components can be made using integrated circuit photolithographic techniques having a relatively high resolution and cost and the destination substrate, for example a printed circuit board, can be made using printed circuit board techniques having a relatively low resolution and cost, the backplane electrical contacts on the destination substrate can be much larger than the connection posts or electrical contacts on the component, facilitating the use of multiple connection posts with a common backplane electrical contact, reducing electrical faults, and reducing manufacturing costs.

In one aspect, the disclosed technology includes a printable component, including: a semiconductor structure with a top side and a bottom side; one or more top electrical contacts on the top side of the semiconductor structure; one or more bottom electrical contacts on the bottom side of the semiconductor structure; and one or more electrically conductive spikes in electrical contact with the one or more top electrical contacts, wherein each spike protrudes from the top side of the semiconductor structure.

In certain embodiments, the printable component includes a layer in contact with the top side of the semiconductor structure and the one or more electrically conductive spikes.

In certain embodiments, each top electrical contact is a portion of the top side of the semiconductor structure.

In certain embodiments, each bottom electrical contact is a portion of the bottom side of the semiconductor structure.

In certain embodiments, each top electrical contact is a conductor disposed on or in the top side of the semiconductor structure.

In certain embodiments, each bottom electrical contact is a disposed on or in the bottom side of the semiconductor structure.

In certain embodiments, the semiconductor structure is a multi-layer semiconductor structure having sub-layers.

In certain embodiments, the semiconductor sub-layers comprises one or more members selected from the group consisting of one or more of a doped semiconductor layer, an n-doped semiconductor layer, and a p-doped semiconductor layer.

In certain embodiments, the each spike of the one or more spikes has a triangular cross section, a trapezoidal cross section, or a rectangular cross section.

In certain embodiments, the each spike of the one or more spikes is a pyramid, a truncated pyramid, a volcano, a cylinder, or a cone.

In certain embodiments, the spike has height greater than 1.5 times the width, a height greater than a base width in contact with the semiconductor structure, or a layer on the semiconductor structure.

In certain embodiments, the spike is a multi-layer spike having a spike material coated with an electrically conductive spike layer.

In certain embodiments, the printable component includes two or more electrically connected spikes protruding from the top side of the semiconductor structure or a layer in contact with the top side of the semiconductor.

In certain embodiments, the printable component includes one or more electrically conductive bottom spikes in electrical contact with the one or more bottom electrical contacts, wherein each bottom spike protrudes from the bottom side of the semiconductor structure.

In certain embodiments, the spike has a roughened surface.

In certain embodiments, the printable component is a light-emitting diode, photo-diode, or transistor.

In certain embodiments, each spike of the one or more electrically conductive spikes has a height that is greater than its base width.

In certain embodiments, each spike of the one or more electrically conductive spikes has a base width that is greater than its peak width.

In certain embodiments, each spike of the one or more electrically conductive spikes has a base area that is greater than its peak area.

In certain embodiments, the printable component has at least one of a width, length, and height from 2 to 5 µm, 5 to 10 µm, 10 to 20 µm, or 20 to 50 µm.

In certain embodiments, one or more spikes are located closer to an end of the printable component structures than to the center of the printable component structures or one or more of the bottom electrical contacts are located closer to an end of the printable component structures than to the center.

In another aspect, the disclosed technology includes a printed structure, including: a destination substrate and one or more backplane electrical contacts; and one or more printable components, wherein the backplane electrical contacts are electrically connected to the bottom electrical contacts.

In certain embodiments, two or more bottom electrical contacts are electrically connected to a common backplane electrical contact.

In certain embodiments, the spike is a multi-layer spike having a spike material coated with an electrically conductive spike layer.

In certain embodiments, the printed structure includes an insulator disposed over at least a portion of the destination substrate and at least a portion of the printable component structure, and exposing a portion of the spike.

In certain embodiments, the printed structure includes a conductor disposed over at least a portion of the insulator and in electrical contact with the spike.

In certain embodiments, the printed structure includes a plurality of the printable component structures, an insulator disposed over at least a portion of each of the printable component structures and exposing a portion of each of the spikes, and the conductor in electrical contact with each of the spikes.

In certain embodiments, the insulator has a rough surface.

In certain embodiments, the printed structure one or more electrically conductive bottom spikes in electrical contact with the one or more bottom electrical contacts, wherein each bottom spike protrudes from the bottom side of the semiconductor structure and is electrically connected to a bottom electrical contact.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In another aspect, the disclosed technology includes a method of making a printed structure, the method including: providing one or more printable component structures on a source substrate; providing a destination substrate having one or more backplane electrical contacts; micro transfer printing the one or more printable component structures from the source substrate onto the destination substrate; disposing an insulator over at least a portion of each of the one or more printable component structures; and disposing a conductor over at least a portion of the insulator in electrical contact with the one or more spikes of each of the one or more printable component structures.

In certain embodiments, the spike protrudes from the insulator after the insulator is disposed over at least a portion of each of the one or more printable component structures.

In certain embodiments, the method includes contacting the stamp to the source wafer, wherein a pillar of the stamp is displaced when placed in contact with the spike of the printable component structure on the source wafer; and removing the stamp from the source wafer to release and align the printable component structure.

In certain embodiments, the method includes blanket etching the dielectric to expose the spike.

In certain embodiments, etching the insulator to expose the spike roughens the surface of the insulator or the spike.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, each printable component of the one or more printable components is a light-emitting diode, photo-diode, or transistor.

In certain embodiments, each spike of the one or more spikes has a height that is greater than its base width.

In certain embodiments, each spike of the one or more spikes has a base width that is greater than its peak width.

In certain embodiments, each spike of the one or more spikes has a base area that is greater than its peak area.

In certain embodiments, the printable component has at least one of a width, length, and height from 2 to 5 µm, 5 to 10 µm, 10 to 20 µm, or 20 to 50 µm.

In another aspect, the disclosed technology includes a stamp for micro transfer printing, including: a body; and one or more pillars extending from the body, each pillar having a structured pillar surface at an side of the pillar opposite the body, wherein the structured surface has a first planar portion and a second recessed portion.

In certain embodiments, a height of each pillar of the one or more pillars is less than a millimeter.

In certain embodiments, the body comprises a first composition and the pillar comprises a second composition, different from the first.

In certain embodiments, the stamp is a Polydimethylsiloxane stamp.

In certain embodiments, the stamp comprises at least one of more than one hundred, one thousand, ten thousand, or ten million pillars.

In certain embodiments, the recessed portion defines a shape with a triangular cross section, a trapezoidal cross section, or a rectangular cross section.

In certain embodiments, the recessed portion defines a pyramid, a truncated pyramid, a volcano, a cylinder, or a cone.

In certain embodiments, the stamp includes a printable component structure for micro transfer printing having first and second elements and wherein the first portion spatially corresponds to a first surface of the first elements and the second surface spatially corresponds to the second elements.

In certain embodiments, the stamp includes a printable component structure for micro transfer printing and wherein the structure pillar surface corresponds to a topographically structured surface of the printable component structure.

In one aspect, the disclosed technology includes a method of making a stamp for micro transfer printing, including: providing a stamp mold having a body and a pillar with a pillar surface at an end of the pillar opposite the body; providing a printable component structure with a structured surface that forms the pillar surface within the stamp mold; disposing curable material in the stamp mold; and curing the curable material to form a stamp having a structured pillar surface.

In certain embodiments, the method includes removing the stamp from the stamp mold and processing the stamp to enlarge at least some of the structures on the pillar surface.

In certain embodiments, the structured pillar surface is a rough surface.

In another aspect, the disclosed technology includes a method of making a printable component structure, including: providing a semiconductor structure; forming a mask layer on a surface of the semiconductor structure; patterning the mask layer to form an etch mask; etching the semiconductor structure to form a protrusion in the semiconductor structure under the etch mask; and removing the etch mask.

In certain embodiments, the method includes coating the protrusion with a conductor to form a conductive spike.

In certain embodiments, coating the protrusion also coats the semiconductor structure and comprising patterning the conductor.

In another aspect, the disclosed technology includes a printed structure, including: a destination substrate; a printable component comprising a semiconductor structure with a top side and a bottom side, the bottom side of the printable component disposed on the destination substrate; and one or more electrically conductive spikes protruding from the top side of the semiconductor structure or a layer in contact with the top side of the semiconductor structure.

In certain embodiments, the printed structure includes an electrical contact on the top side of the semiconductor structure.

In certain embodiments, the spike is electrically connected to the electrical contact.

In certain embodiments, the printed structure includes a backplane electrical contact on the destination substrate that is electrically connected to the printable component.

In certain embodiments, the destination substrate is a member selected from the group consisting of polymer, plastic, resin, polyimide, PEN, PET, metal, metal foil, glass, a semiconductor, and sapphire.

In certain embodiments, the destination substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm.

In certain embodiments, each printable component of the one or more printable components is a light-emitting diode, photo-diode, or transistor.

In certain embodiments, each spike of the one or more spikes has a height that is greater than its base width.

In certain embodiments, each spike of the one or more spikes has a base width that is greater than its peak width.

In certain embodiments, each spike of the one or more spikes has a base area that is greater than its peak area.

In certain embodiments, the printable component has at least one of a width, length, and height from 2 to 5 µm, 5 to 10 µm, 10 to 20 µm, or 20 to 50 µm.

The present invention provides structures and methods that enable the construction of electrical interconnections between small integrated circuits that are transfer printed on a destination substrate. The electrical interconnection process is simple and inexpensive requiring fewer process steps than known alternative methods.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 13-14 are flow charts illustrating methods of the present invention;

FIGS. 16-21 are cross sections of steps useful in forming a spike according to a method of the present invention.

Figure 1:
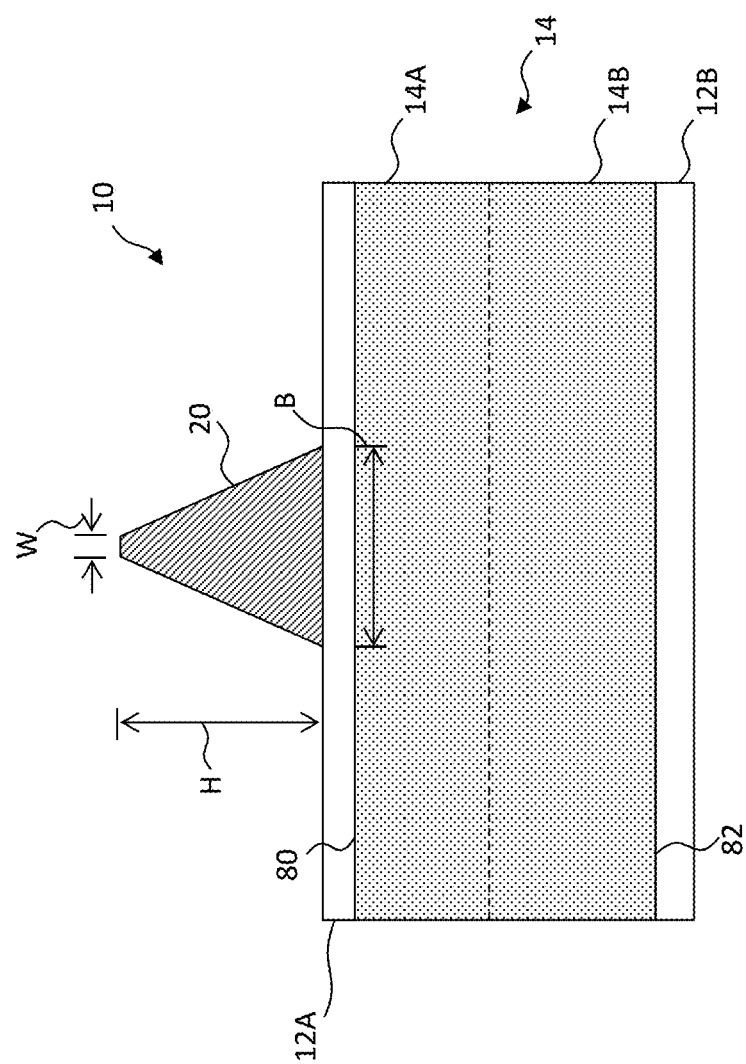
FIG. 1 is a cross section of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

The present invention provides a structure and method for electrically connecting relatively small electrical components such as integrated circuit chiplets to a common electrical conductor in an efficient and cost-effective way. The common electrical conductor can be a ground plane or power plane. Referring to the cross section of FIG. 1, in an embodiment of the present invention, a printable component structure 10 can be a chiplet that includes a semiconductor structure 14 with a top side 80 and a bottom side 82. One or more top electrical contacts 12A are disposed on the top side 80 of the semiconductor structure 14 and one or more bottom electrical contacts 12B are disposed on the bottom side 82 of the semiconductor structure 14. The semiconductor structure 14 can include a semiconductor substrate. One or more electrically conductive spikes 20 are electrically connected to the one or more top electrical contacts 12A. Each spike 20 protrudes from the top side 80 of the semiconductor structure 14 or a layer (e.g., top electrical contact 12A) in contact with the top side 80 of the semiconductor structure 14. The spike 20 can be an electrical conductor, a connector, or a connection post. The spike 20 can have a roughened surface, for example produced by etching a surface of the spike 20. As those knowledgeable in the art will appreciate, top and bottom are relative terms that can be reversed by re-orienting the printable component structure 10. Top or bottom do not necessarily refer to a specific orientation of the component (e.g., top could be facing down or sideways). For example, top and bottom can mean first and second.

The semiconductor structure 14 can be any semiconductor substrate including silicon, GaN, substrates used for integrated circuit processors, integrated circuit light emitters such as LEDs, or integrated circuit photodiodes. The printable component structures 10 made by methods of the present invention can include or be a variety of chiplets having semiconductor structures, including a diode, a light-emitting diode (LED), a transistor, or a laser. Chiplets are small integrated circuits (e.g., LEDs), can be unpackaged dies released from a source wafer, and can be micro transfer printed. Chiplets can have at least one of a width, length, and height from 2 to 5 µm, 5 to 10 µm, 10 to 20 µm, or 20 to 50 µm. Chiplets can have a doped or undoped semiconductor structure 14 thickness of 2 to 5 µm, 5 to 10 µm, 10 to 20 µm, or 20 to 50 µm. The chiplet or printable component structures 10 can be micro-light-emitting diodes with a length greater than width, for example having an aspect ratio greater than or equal to 2, 4, 8, 10, 20, or 50 and component contact pads (e.g., top or bottom electrical contacts 12A, 12B) that are adjacent to the ends of the printable component structures 10 along the length of the printable component structures 10. By placing the top or bottom electrical contacts 12A, 12B (contact pads) adjacent to the ends of the printable component structures 10, light emitted from the central portions of the printable component structures 10 is not blocked or occluded by the top or bottom electrical contacts 12A, 12B.

The top and bottom electrical contacts 12A, 12B can be metal contacts connected to circuitry through wires formed in the printable component structures 10, for example a conductor formed on or in the top side 80 of the semiconductor structure 14 or a conductor formed on or in the bottom side 82 of the semiconductor structure 14. Alternatively, each top electrical 12A contact is a portion of the top side 80 of the semiconductor structure 14 or each bottom electrical contact 12B is a portion of the bottom side 82 of the semiconductor structure 14. Contacts, conductors, and circuitry can be formed using photolithographic techniques.

The semiconductor structure 14 can be a multi-layer semiconductor structure 14 having sub-layers. For example, the semiconductor sub-layers can include one or more of a doped semiconductor layer, an n-doped semiconductor layer 14A, or a p-doped semiconductor layer 14B. Electrical current passing through the n- and p-doped semiconductor layers 14A, 14B can cause the semiconductor layers to emit light.

Figure 3:
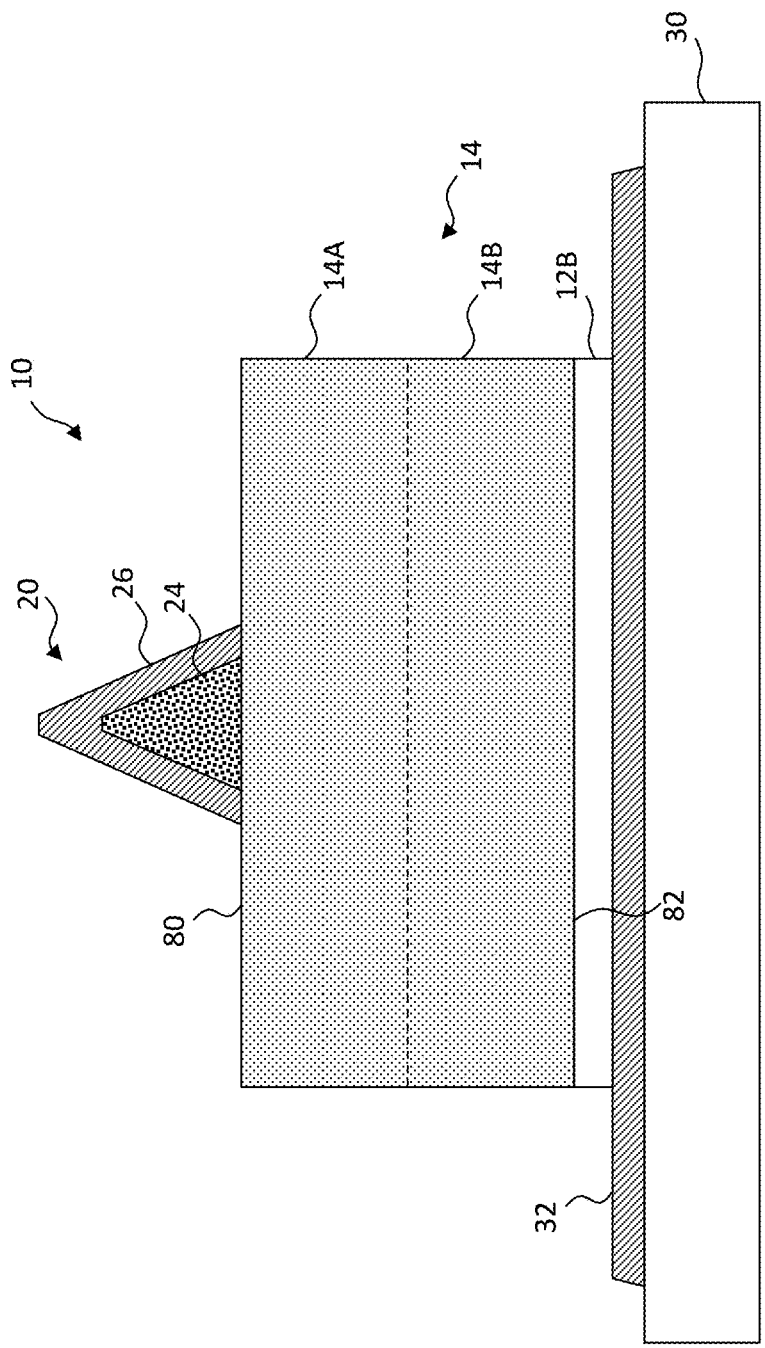
FIG. 3 is a cross section of another embodiment of the present invention having multi-layer spike.
Figure 12:
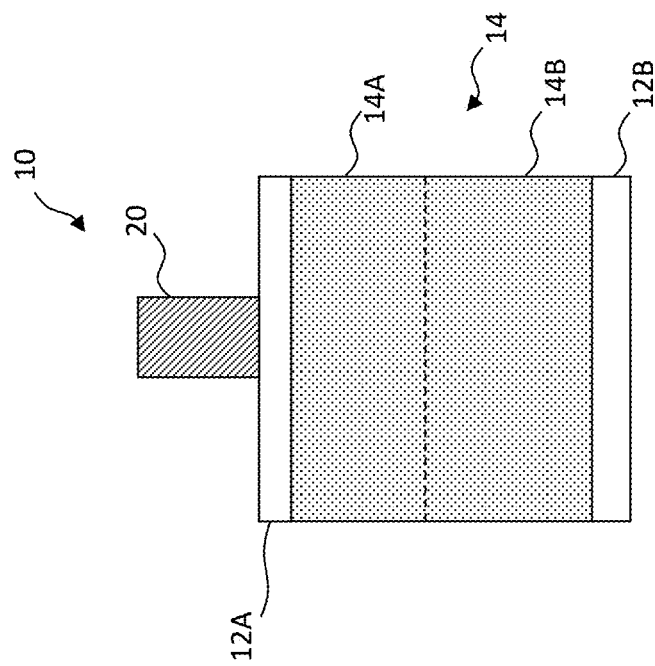
FIGS. 11-12 are cross sections of alternative spikes in different embodiments of the present invention.
Figure 11:
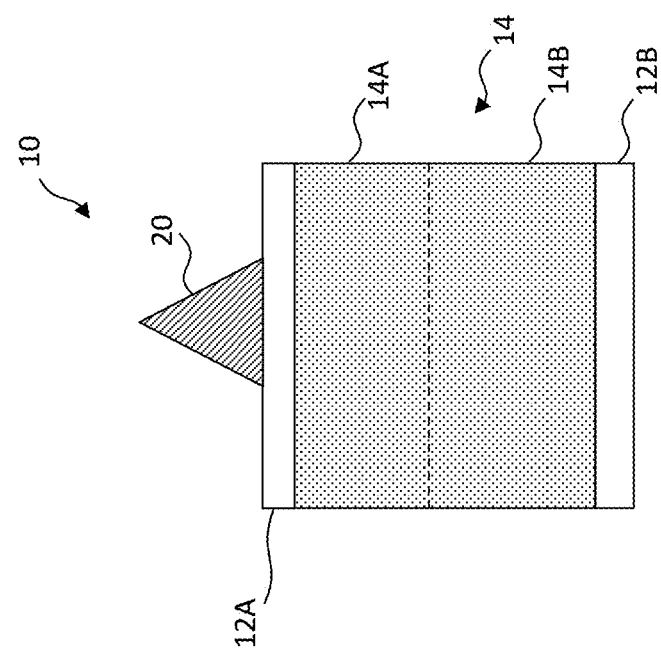

In various embodiments of the present invention, the spike 20 has a triangular cross section (as shown in FIG. 11), a trapezoidal cross section (as shown in FIG. 1), or a rectangular cross section (as shown in FIG. 12), or the spike 20 is a pyramid, a truncated pyramid, a cylinder, a volcano, or a cone. The spike 20 can have a height H greater than 1.5 times the width, a height H greater than a base width B in contact with the semiconductor structure 14 or a layer on the semiconductor structure 14 (e.g., top electrical contact 12A). The spike 20 can have a base width B greater than a peak width W (as shown in FIG. 1) or equal to a peak width W (as shown in FIG. 12). The peak of the spike 20 can be a sharp point (as shown in FIG. 11). As shown in FIG. 3, the spike 20 can be a multi-layer spike, for example having a spike material 24 coated with an electrically conductive spike layer 26.

In certain embodiments, the height of the spike is greater than the height of the printable component. In certain embodiments, the height of the spike is less than the height of the printable component. In certain embodiments, the height of the spike is the same as the height of the printable component. In certain embodiments, the width of a base of the spike is less than the width of the printable component.

Figure 2:
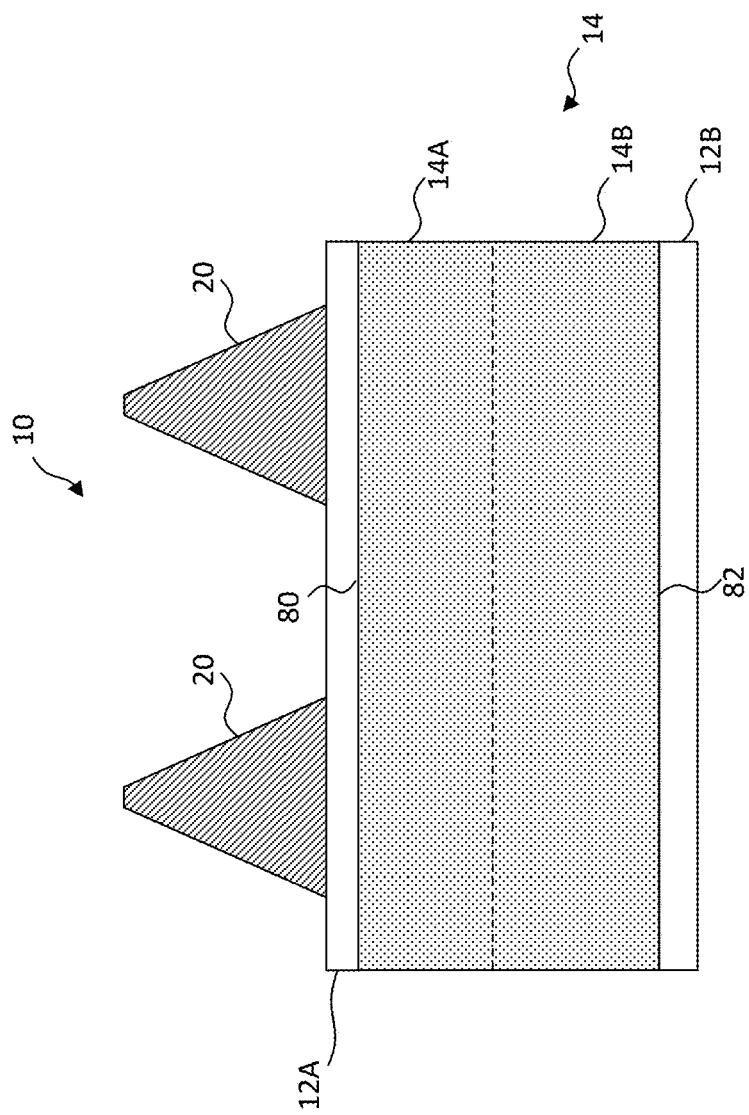
FIG. 2 is a cross section of an alternative embodiment of the present invention having electrically shorted spikes.

As shown in FIG. 2, in an embodiment of the printable component structure 10 two or more electrically connected spikes 20 protrude from the top side 80 of the semiconductor structure 14 or a layer (for example top electrical contact 12A) in contact with the top side 80 of the semiconductor structure 14.

As shown in FIG. 3, in an embodiment the bottom electrical contact 12B of the printable component structure 10 is electrically connected to a backplane electrical contact 32 of a destination substrate or backplane 30. The backplane electrical contact 32 and the bottom electrical contact 12B can be transparent and the chiplet can be a light emitter, such as an LED, that emits light through the backplane electrical contact 32 and the bottom electrical contact 12B. Alternatively, the component top electrical contact 12A or the spike 20, or both can be transparent and the printable component structure 10 can be a light emitter, such as an LED, that emits light through the component top electrical contact 12A or the spike 20. Although illustrated in the center of the semiconductor structure 14 in FIGS. 1-3, in other embodiments the spike 20 is closer to an end of the semiconductor structure 14 than to the center of the printable component structures 10 so that light emitted from the printable component structures 10 does not (or no more than a minimal amount of light) pass through the spike 20 or the component top electrical contact 12A. Alternatively, backplane electrical contact 32 and the bottom electrical contact 12B are located closer to an end of the printable component structures 10 than to the center of the printable component structures 10 so that light emitted from the printable component structures 10 does not pass through the backplane electrical contact 32 and the bottom electrical contact 12B.

Figure 4:
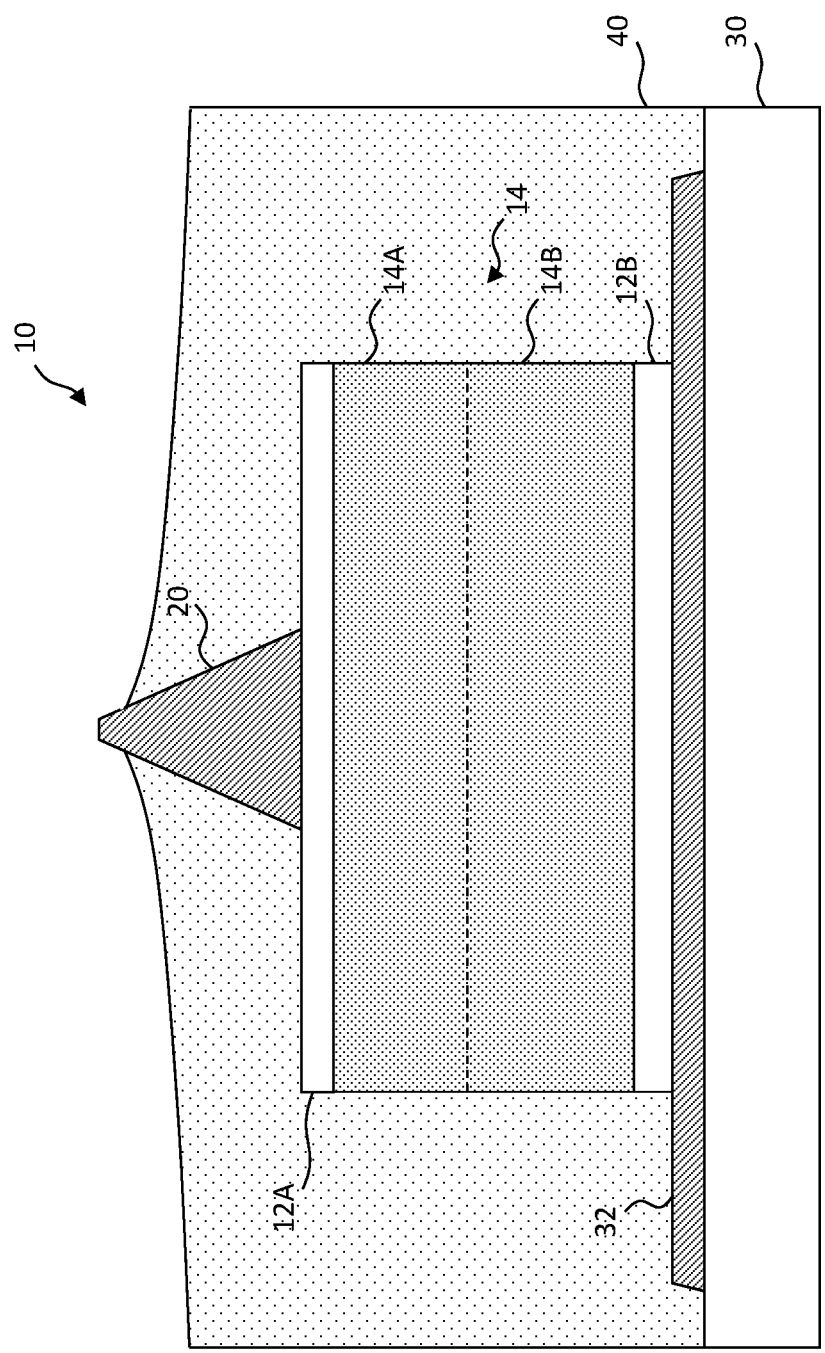
FIG. 4 is a cross section of an embodiment of the present invention including a printable component structure and destination substrate with an insulator according to an embodiment of the present invention.
Figure 5:
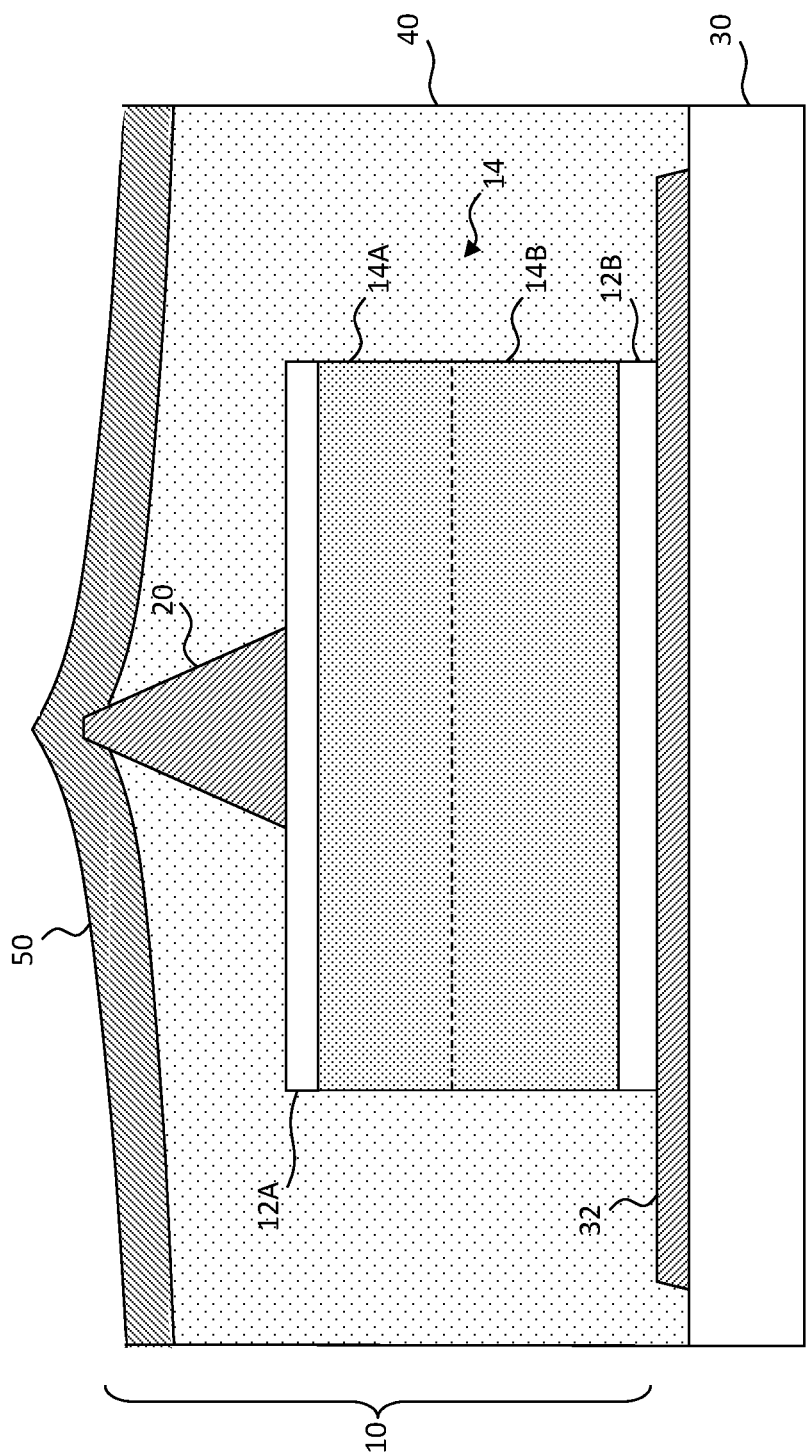
FIG. 5 is a cross section of an embodiment of the present invention including a printable component structure and destination substrate with an insulator and conductor according to another embodiment of the present invention.

Referring next to FIG. 4, in an embodiment of the present invention, an insulator 40 is disposed over at least a portion of the destination substrate 30 (or a layer on the destination substrate 30) and at least a portion of the printable component structure 10 and exposes a portion of the spike 20. The insulator 40 can be an inorganic dielectric such as silicon dioxide or silicon nitride or an organic dielectric such as a polymer, a curable polymer, a photoresist, a resin, or epoxy. As shown in FIG. 5, a conductor 50 is disposed over at least a portion of the insulator 40 and is in electrical contact with the spike 20. In a further embodiment of the present invention, a plurality of the printable component structures 10 are disposed on the destination substrate 30. The insulator 40 is disposed over at least a portion of each of the plurality of printable component structures 10 and exposes a portion of each of the spikes 20. The conductor 50 is disposed over the insulator 40 and is in electrical contact with each of the spikes 20 so that all of the printable component structures 10 is electrically connected in common. The conductor 50 can be a metal, can include metal, can be a metal alloy, can include a metal alloy, or can be a metal oxide such as indium tin oxide or aluminum zinc oxide. The conductor 50 can be transparent or opaque and can be deposited, for example, by evaporation, sputtering, chemical vapor deposition (CVD), or atomic layer deposition (ALD).

Figure 6:
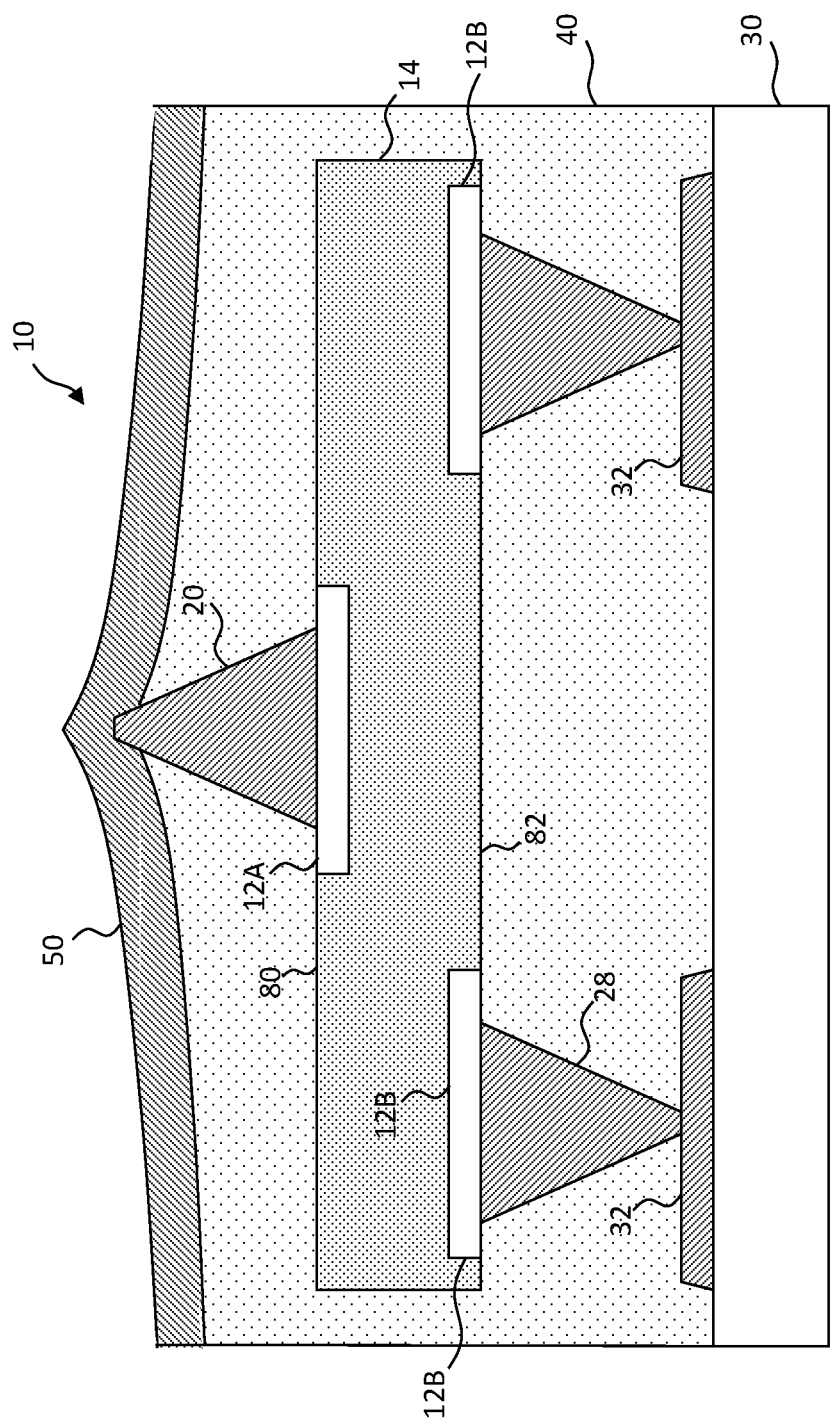
FIG. 6 is a cross section illustrating an embodiment of the present invention with spikes on both a top side and a bottom side of a chiplet.
Figure 10:
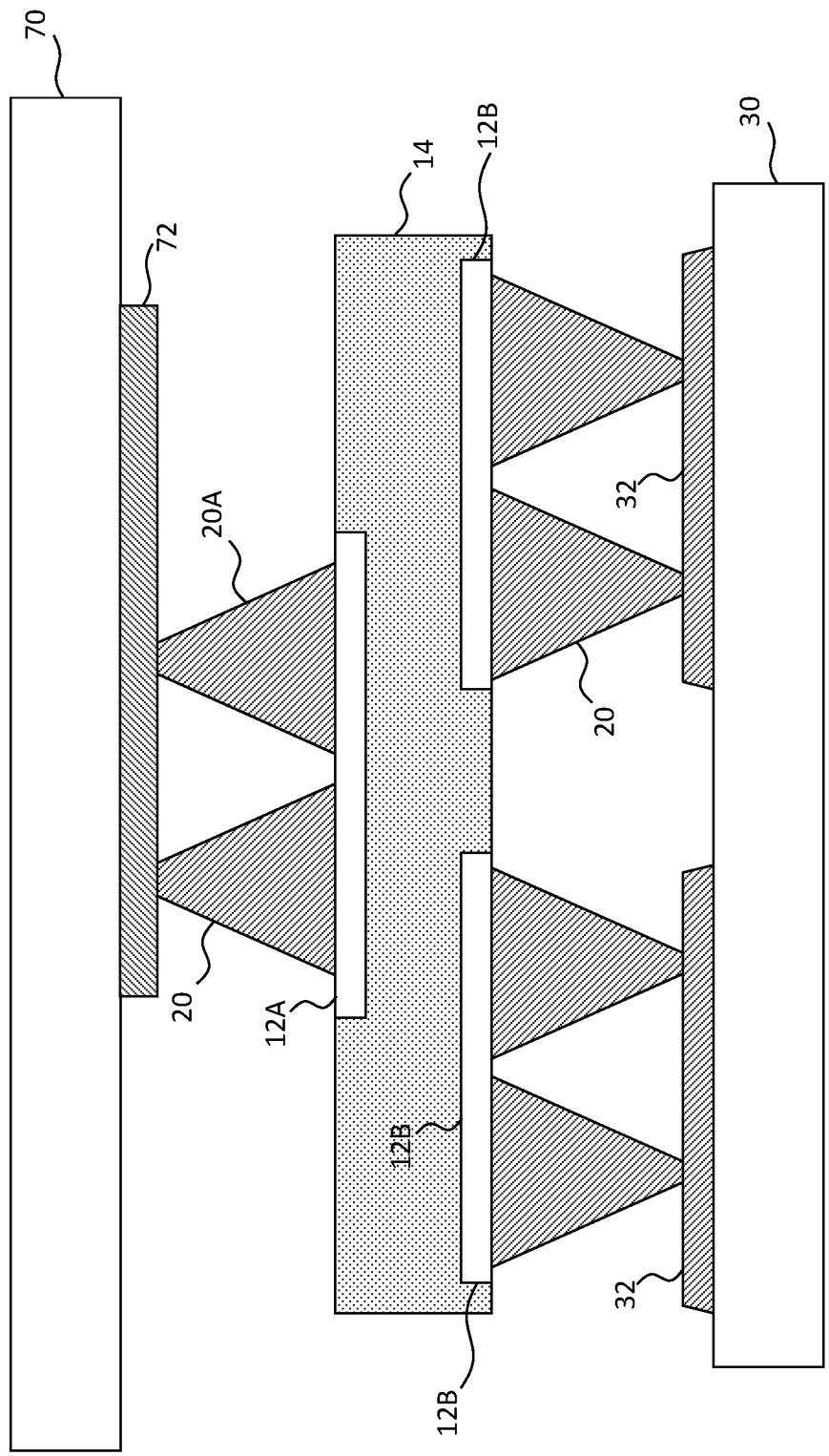
FIG. 10 is a cross section of an alternative embodiment of the present invention having electrically shorted spikes for both a tile and a backplane.

Referring to FIG. 6, in another embodiment of the present invention, one or more electrically conductive bottom spikes 28 are in electrical contact with the one or more bottom electrical contacts 12B (or directly to the semiconductor structure 14). Each bottom spike 28 protrudes from the bottom side 82 of the semiconductor structure 14 or a layer in contact with the bottom side 82 of the semiconductor structure 14. As shown in FIG. 6, the printable component structure 10 can have two or more bottom spikes 28 each electrically connected to a different backplane electrical contact 32 on destination substrate 30. As shown in the embodiment of FIG. 10, two or more bottom spikes 28 are electrically connected to a common backplane electrical contact 32 and a common bottom electrical contact 12B. As is also shown in FIG. 2, two or more spikes 20 are electrically connected in common to a top electrical contact 12A. Such redundant electrical connections reduce electrical faults when micro transfer printing the printable component structures 10 to a destination substrate 30.

Figure 7:
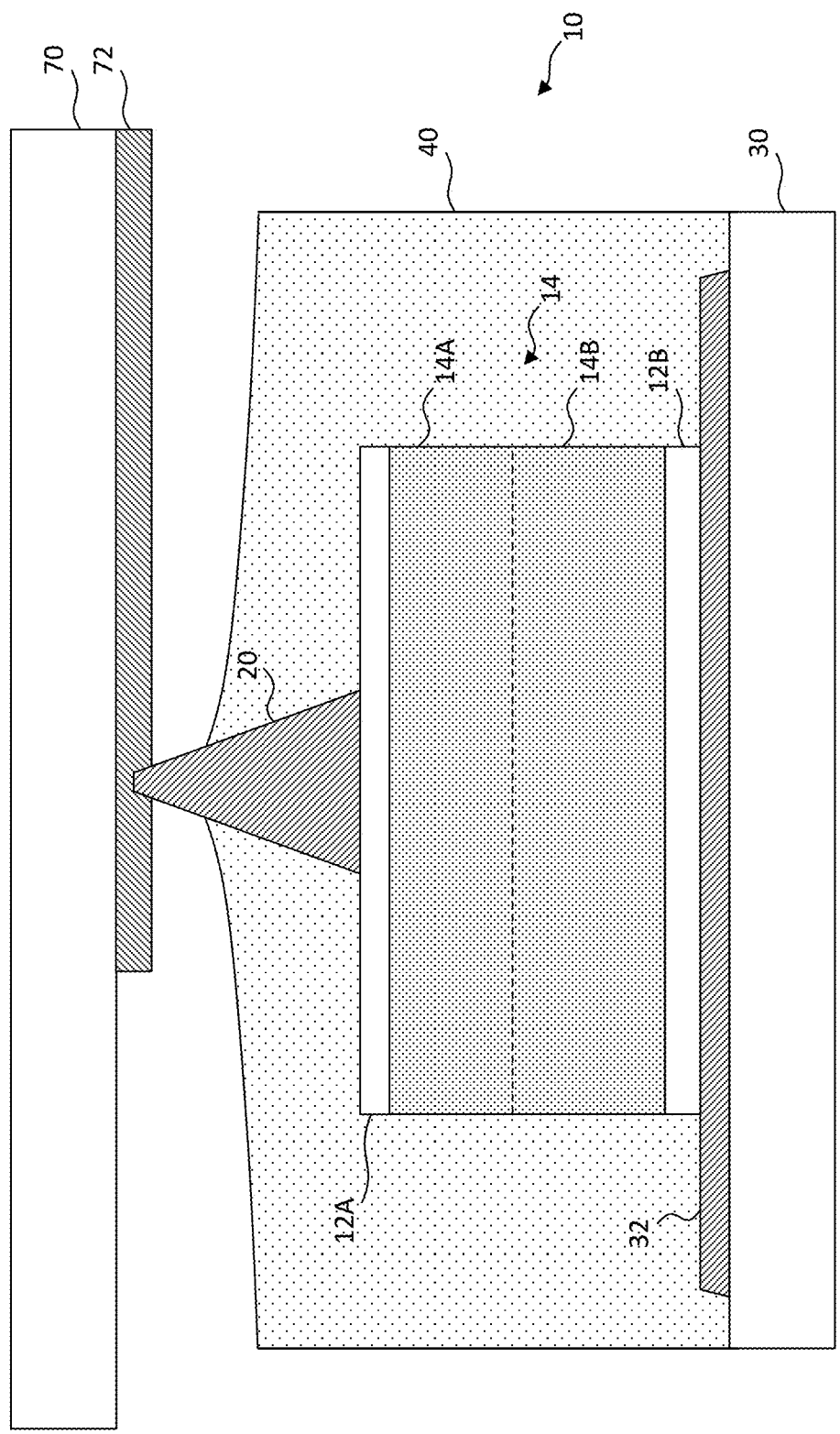
FIG. 7 is a cross section of an embodiment of the present invention with an electrically connected tile.

As shown in the embodiment of FIG. 7, a tile 70 is electrically connected through a tile electrical contact 72 to the spike 20. The tile 70 can be micro transfer printed onto the spike 20 and over the printable component structures 10 to make a multi-layer structure with compound substrates. FIG. 10 illustrates the tile 70 with redundant spikes 20 and redundant bottom spikes 28.

Figure 8:
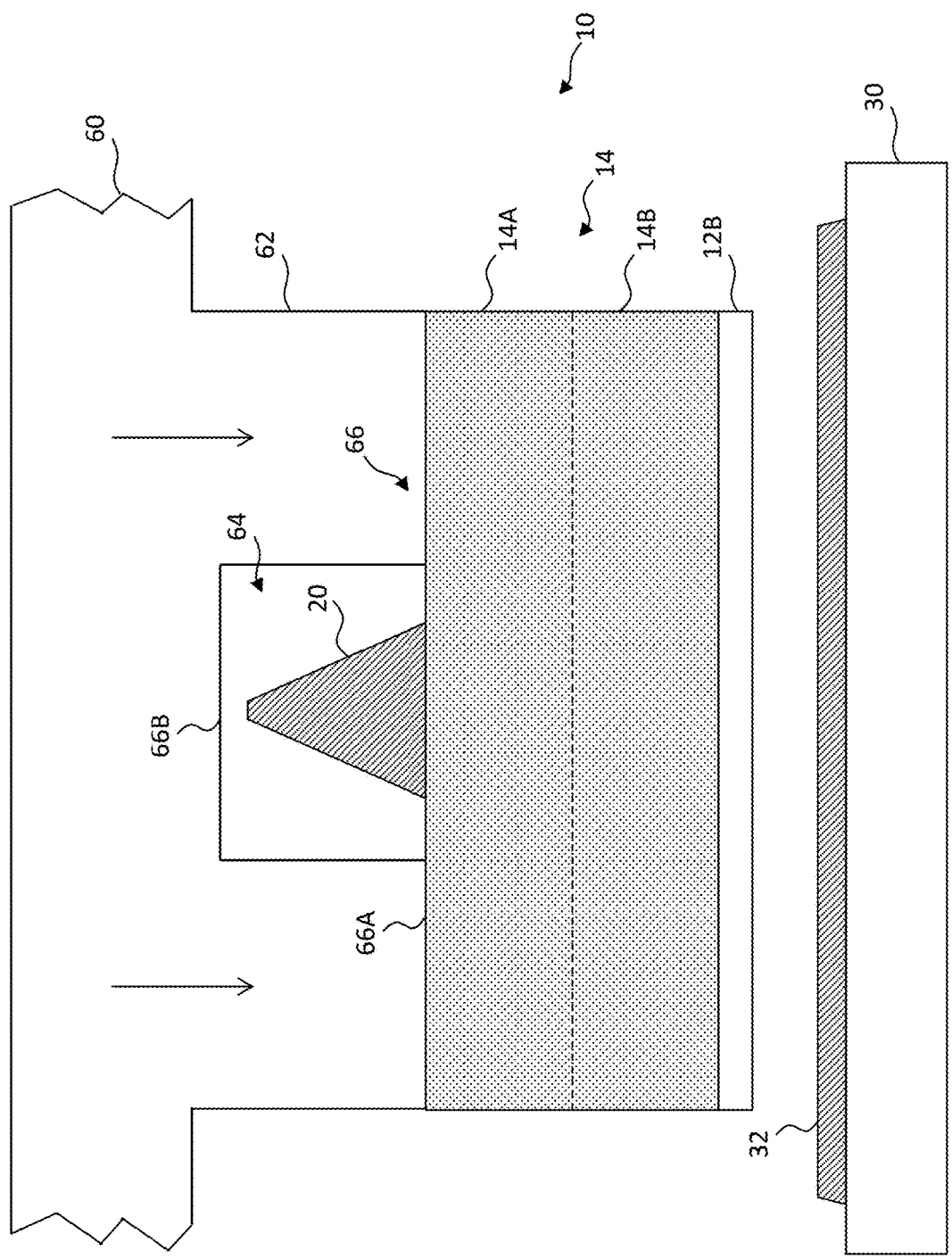
FIG. 8 is a cross sectional illustration of micro transfer printing a printable component structure according to an embodiment of the present invention.

According to a method of the present invention and referring to both FIG. 8 and to FIG. 13, a printed structure is made by providing one or more printable component structures 10 on a source substrate in step 100. A stamp 60 is provided in step 102 and a destination substrate 30 in step 106. The destination substrate 30 has one or more backplane electrical contacts 32. The one or more printable component structures 10 are contacted with the stamp 60 on the source wafer in step 110 and then aligned to the destination substrate 30 in step 120 and micro transfer printed from the source substrate onto the destination substrate 30 in step 130. The insulator 40 is disposed over at least a portion of each of the one or more printable component structures 10 in step 140. In one embodiment, the insulator 40 is provided in such an amount or in such a way that the spike 20 is exposed, for example by controlling a coating process such as spin or curtain coating. Alternatively, the insulator 40 is provided in such an amount or in such a way that the spike 20 is covered. In optional step 150 the insulator 40 is blanket etched to expose the spike 20. A blanket etch is an unpatterned etch that does not require, for example, the deposition and patterned exposure of a photoresist followed by a patterned etch. By enabling an unpatterned etch step to expose the spike 20, the present invention provides advantages over methods and structures of the prior art. A conductor 50 is then disposed over at least a portion of the insulator 40 in electrical contact with the one or more spikes 20 of each of the one or more printable component structures 10 in step 160, for example by evaporation, sputtering, CVD, or ALD.

Figure 9:
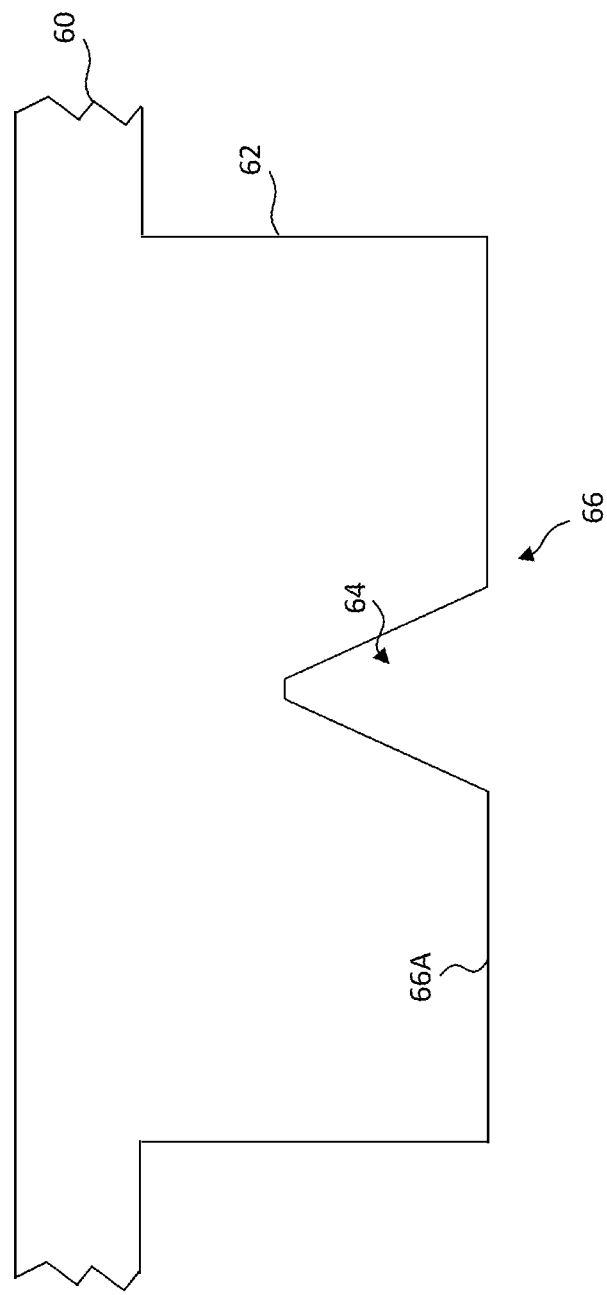
FIG. 9 is an illustration of a micro transfer printing stamp according to an embodiment of the present invention.

As shown in FIG. 8, the stamp 60 has a body with a pillar 62 having a structured pillar surface 66 at an end of the pillar 62 opposite the body. The structured pillar surface 66 includes a recess 64 forming a stamp cavity in the pillar 62. A pillar 62 serves to release and print a single printable component structure 10. In such an arrangement, the structured pillar surface 66 has a first portion 66A substantially in a plane and a second portion 66B that is not in the plane. The second portion 66B is recessed from the first portion 66A. Alternatively or in addition, the second portion 66B has surfaces that are parallel or perpendicular to the first portion 66A. Thus, the spike 20 of the printable component structure 10 is located in the recess 64 so that the first portion 66A of the stamp 60 can contact the printable component structure 10 to enable transfer printing. In another embodiment, referring to FIG. 9, the stamp 60 has a pillar 62 with a structured pillar surface 66 with a recess 64 that matches the shape of the topographically structured surface of a printable component structure 10. This increases the area of the printable component structure 10 that is in contact with the structured pillar surface 66 of the pillar 62 of the stamp 60, thereby increasing the effectiveness of the transfer.

In yet another embodiment, the stamp 60 is misaligned with the printable component structure 10 when the stamp 60 is contacted to the source wafer on which the printable component structure 10 is formed so that a pillar 62 of the stamp 60 is displaced when placed in contact with the spike 20 of the printable component structure 10 on the source wafer. When the stamp 60 is removed from the source wafer to release the printable component structure 10, the pillar 62 relaxes from its displaced state and moves the printable component structure 10 with respect to the stamp body (but not the pillar 62). When the stamp 60 is aligned with the printable component structure 10 in step 120, the printable component structure 10 is then properly aligned with the destination substrate 30. Thus the structured pillar surface 66 of the pillar 62 of the stamp 60 serves to improve printing registration when used for micro transfer printing.

Figure 14:
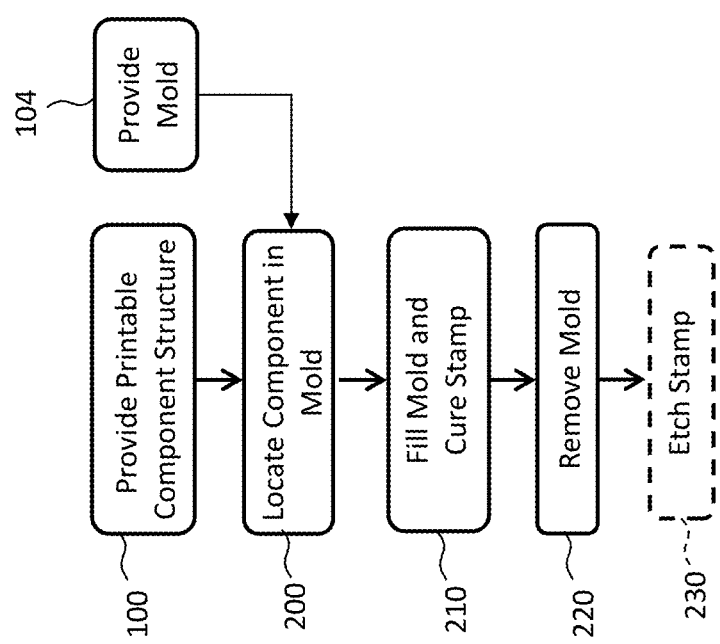

Referring to FIG. 14, a stamp 60 having a structured pillar surface 66 can be made by providing a stamp mold having pillars with a pillar surface at an end of the pillar opposite the body in step 104. In step 100, a printable component structure 10 with a structured surface is provided and disposed in the stamp mold in step 200 to form a reverse of the structured pillar surface 66 within the stamp mold. Curable material (e.g., PDMS) is provided in the stamp mold and cured in step 210 to form a stamp 60 having a structured pillar surface 66 complementary to the surface of the printable component structure 10. The stamp 60 can be removed in step 220 from the stamp mold and processed, for example by etching, in step 230 to enlarge at least some of the structures on the structured pillar surface 66, thus reducing the alignment necessary when contacting the printable component structure 10 with the stamp 60. The structured pillar surface 66 can be a rough surface.

The printable component structure 10 can be an active component, for example including one or more active elements such as electronic transistors or diodes or light-emitting diodes and photodiodes that produce an electrical current in response to ambient light. Alternatively, the printable component structure 10 can be a passive component, for example including one or more passive elements such as resistors, capacitors, or conductors. In another embodiment, the printable component structure 10 is a compound printable component structure 10 that includes both active and passive elements. The printable component structure 10 can be a semiconductor device having one or more semiconductor layers 11, such as an integrated circuit or chiplet. The printable component structure 10 can be an unpackaged die. In yet another embodiment, the printable component structure 10 is a compound element having a plurality of active or passive elements, such as multiple semiconductor devices with separate substrates, each with one or more active elements or passive elements, or both. In certain embodiments, the plurality of elements is disposed and interconnected on a compound element substrate separate from the substrates of any semiconductor devices or a different substrate. The compound element can be micro transfer printed itself after the elements have been arranged and interconnected thereon. The printable component structures 10 can be electronic processors, controllers, drivers, light-emitting diodes, photodiodes, light-control devices, or light-management devices.

The printable component structures 10 can include active elements such as electronic circuits formed using lithographic processes and can include passive elements such as electrical connections, e.g., wires, to the component top and bottom electrical contacts 12A, 12B and spikes 20. In certain embodiments, the component top electrical contacts 12A are planar electrical connections formed on the process side of the printable component structures 10 and source wafer. Component top and bottom electrical contacts 12A, 12B are typically formed from metals such as aluminum or polysilicon using masking and deposition processes used in the art. In certain embodiments, the component top and bottom electrical contacts 12A, 12B are electrically connected to a circuit with wires. In another embodiment the component top and bottom electrical contacts 12A, 12B are directly electrically connected to the circuit without intervening wires. In some embodiments, component top and bottom electrical contacts 12A, 12B, the circuit, and the spikes 20, together with other functional structures formed in the active layer on the source wafer make up the printable component structures 10, or chiplet.

In some embodiments, the component top or bottom electrical contacts 12A, 12B are omitted and the spikes 20 are directly electrically connected to the semiconductor layer(s) 14. In an embodiment in which the printable component structure 10 is a light emitter, the component top or bottom electrical contacts 12A, 12B can be current spreaders that increase the area of the semiconductor layer 14 that emits light.

In some embodiments of the present invention, the printable component structures 10 are small integrated circuits, for example chiplets, having a thin substrate with a thickness of only a few microns, for example less than or equal to 25 microns, less than or equal to 15 microns, or less than or equal to 10 microns, and a width or length of 5-10 microns, 10-50 microns, 50-100 microns, or 100-1000 microns. Such chiplet printable component structures 10 can be made in a source semiconductor wafer (e.g., a silicon or GaN wafer) having a process side and a back side used to handle and transport the wafer. Printable component structures 10 are formed using lithographic processes in an active layer on or in the process side of the source wafer. An empty release layer space is formed beneath the printable component structures 10 with tethers connecting the printable component structures 10 to the source wafer in such a way that pressure applied against the printable component structures 10 breaks the tethers to release the printable component structures 10 from the source wafer (e.g., with stamp 60). Methods of forming such structures are described, for example, in the paper *AMOLED Displays using Transfer-Printed Integrated Circuits* and U.S. Pat. No. 8,889,485 referenced above. Lithographic processes for forming printable component structures 10 in a source wafer, for example transistors, wires, and capacitors, are found in the integrated circuit art.

According to various embodiments of the present invention, the native source wafer can be provided with the printable component structures 10, release layer, tethers, and spikes 20 already formed, or they can be constructed as part of the process of the present invention.

Figure 15:
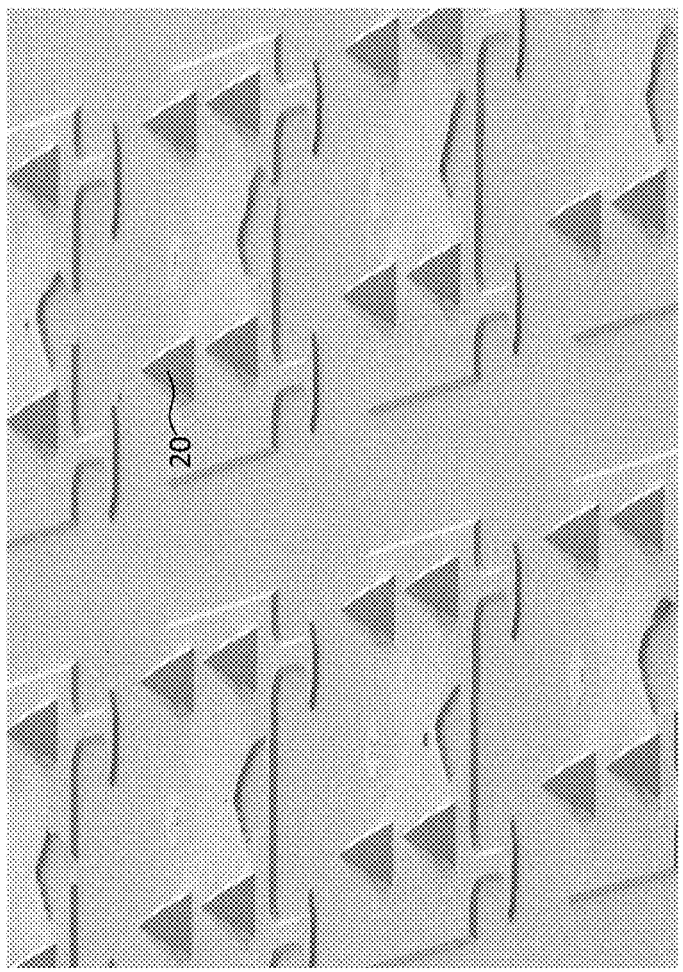
FIG. 15 is a micrograph of a spike according to an embodiment of the present invention.
Figure 16:
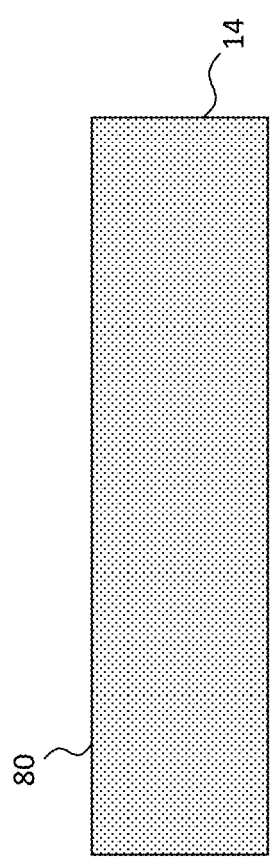
Figure 17:
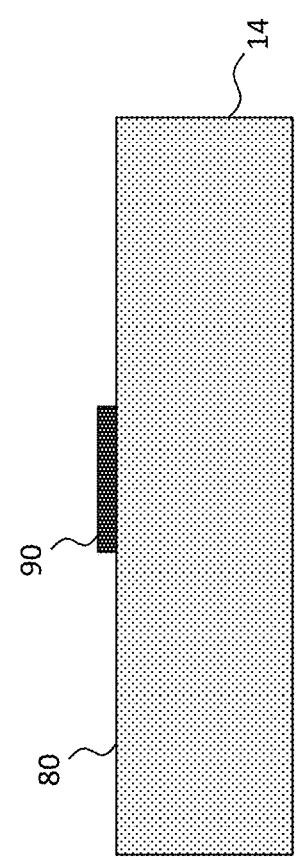
Figure 20:
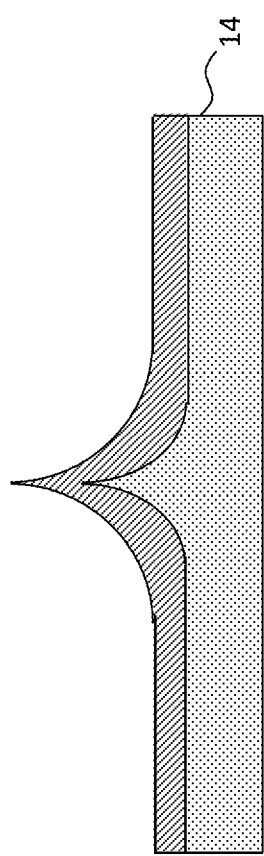

Spikes 20 are electrical connections formed on the top side 80 of the semiconductor structure 14 that extend generally perpendicular to the surface of the top side 80. Such spikes 20 can be formed from metals such as aluminum, titanium, tungsten, copper, silver, gold, or other conductive metals. The spikes 20 can be formed by repeated masking and deposition processes that build up three-dimensional structures. In some embodiments, the spikes 20 are made of one or more high elastic modulus metals, such as tungsten. As used herein, a high elastic modulus is an elastic modulus sufficient to maintain the function and structure of the spike 20 when pressed into a backplane electrical contact 32 or tile electrical contact 72, as described above with respect to FIGS. 6 and 7. FIG. 15 is a micrograph of spikes 20 made on a semiconductor substrate.

In certain embodiments, the component top and bottom electrical contacts 12A, 12B include patterned metal layers. The component top and bottom electrical contacts 12A, 12B can be made using integrated circuit photolithographic methods. Likewise, the spikes 20 can be made by etching one or more layers of metal evaporated or sputtered on the process side of the printable component structure 10. Such structures can also be made by forming a layer above the printable component structure 10 surface, etching a well into the surface, filling it with a conductive material such as metal, and then removing the layer.

Figure 21:
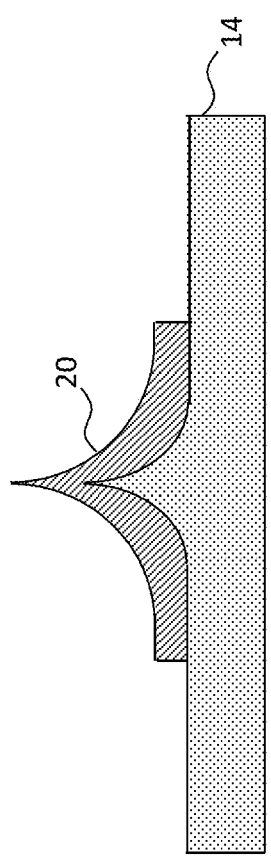

In an alternative method, referring to FIGS. 16-21 the spikes 20 are made by first providing the semiconductor structure 14 (FIG. 16) and then depositing a template film (e.g. silicon) that is patterned to form an etch mask 90 (FIG. 17), followed by an isotropic etch (e.g., SF6 reactive ion etch) that undercuts the patterned etch mask 90 to make a spike in the semiconductor structure 14 (FIG. 18). (Anisotropic etches are also feasible.) The etch mask 90 is removed (FIG. 19). A metal layer is then deposited (FIG. 20) and patterned over the patterned template film spike to form the electrically conductive spike 20 (FIG. 21).

In some embodiments, the spikes 20 are electrically connected to the circuit and the spikes 20 and the circuit, together with other functional active or passive structures formed in the active layer on the source wafer, make up the printable component structure 10.

The spikes 20 can have a variety of aspect ratios and typically have a peak area smaller than a base area. The spikes 20 can have a sharp point for embedding in or piercing backplane electrical contacts 32 (described further below). Printable component structures 10 with protrusions are generally are discussed in U.S. Pat. No. 8,889,485 whose contents are incorporated by reference herein in their entirety.

In an embodiment the spikes 20 include a spike material 24 coated with an electrically conductive spike layer 26 different from the spike material 24. The spike material 24 can be an electrically conductive metal or a doped or undoped semiconductor or an electrically insulating polymer, for example a resin, cured, resin, or epoxy and can have any of a variety of hardness or elastic modulus values. In an embodiment, the spike material 24 is softer than the conductive spike layer 26 so that the conductive material can crumple when the spike 20 is under mechanical pressure. Alternatively, the conductive spike layer 26 is softer than the spike material 24 so that it deforms before the spike material 24 when under mechanical pressure. By deform is meant that the spike 20 or the backplane electrical contacts 32 or tile electrical contacts 72 or conductive material change shape as a consequence of the transfer printing.

The multi-layer spike 20 can be made using photolithographic methods, for example coating and then pattern-wise curing materials such as resins or metals that can be etched. The multi-layer spike 20 or spike material 24 can be a semiconductor material, such as silicon or GaN, formed by etching material from around the spike 20. Coatings, such as the conductive material can be evaporated or sputtered over the spike material 24 structure and then pattern-wise etched to form the multi-layer spike 20 of FIG. 3. The conductive material can be a solder or other metal or metal alloy that flows under a relatively low temperature, for example less than 120 degrees C. In particular, the conductive material of the conductive spike layer 26 can have a melting point less than the melting point of the spike material 24.

As shown in FIG. 10, in an embodiment of the present invention, two or more spikes 20 are directly electrically connected. Two or more spikes 20 together form groups of spikes 20. The spikes 20 in a common group are electrically connected or shorted, for example by a top electrical contact 12A. In a useful arrangement, the spikes 20 in a common group are separated by a distance that is less than the distance between spikes 20 in different groups so that the spikes 20 within a group are located closer together than spikes 20 in different groups. In yet another embodiment, referring to FIG. 10, a short spike 20A has a different height than another spike 20, for example another spike 20 within a common group with the short spike 20A. Multiple spikes 20 having different heights that are electrically connected provide a redundant means for connection to a common electrical connection. As those skilled in the art will understand, it is important that electrical connections between the printable component structures 10 and an external electrical structure such as the backplane 30 are reliable and effective. By providing multiple spikes 20 with different structures, such as heights, that are electrically connected in the printable component structure 10, the likelihood of an electrical connection failure between the printable component structure 10 and an external device are reduced.

In an embodiment of the present invention as shown in FIG. 10, a printed structure includes a tile 70 that has a different substrate than the substrates of the printable component structures 10 and is not native to the printable component structures 10. The tile 70 can be a backplane or a front plane and has one or more printable component structures 10 and two or more tile electrical contacts 72. Each spike 20 can be in contact with, extend into, or extend through a tile electrical contact 72 of the tile 72 to electrically connect the tile electrical contacts 72 to the spikes 20. The tile electrical contacts 72 can be electrically conductive and connected through wires or conductive traces to other components or structures on the tile 70.

In an embodiment of the present invention as also shown in FIG. 10, a printed structure includes a destination substrate 30 that is a different substrate than the substrates of the printable component structures 10 and is not native to the printable component structures 10. The destination substrate 30 can be a backplane and has one or more printable component structures 10 and two or more backplane electrical contacts 32. Each bottom spike 28 can be in contact with, extend into, or extend through a backplane electrical contact 32 of the destination substrate 30 to electrically connect the backplane electrical contacts 32 to the bottom spikes 28. The backplane electrical contacts 32 can be electrically conductive and connected through wires or conductive traces to other components or structures on the destination substrate 30.

As shown in FIG. 10, spikes and component electrical contacts can be disposed on both the top and bottom of the printable component structures 10. Thus, spikes can connect both the tile electrical contacts 72 of the tiles 70 and the backplane electrical contacts 32 of the destination substrate 30. Therefore, the materials, methods, and structures described below apply to both the tile electrical contacts 72 of the tiles 70 and the backplane electrical contacts 32 of the destination substrate 30. In the discussion below, spikes 20 and bottom spikes 28 are not distinguished.

The backplane and tile electrical contacts 32, 72 can be made of a relatively soft metal, such as tin, solder, or tin-based solder, to assist in forming good electrical contact with the spikes 20 and adhesion with the printable component structures 10. As used herein, a soft metal may refer to a metal into which a spike 20 can be pressed to form an electrical connection between the spike 20 and the backplane or tile electrical contact 32, 72. In this arrangement, the backplane or tile electrical contact 32, 72 can plastically deform and flow under mechanical pressure to provide a good electrical connection between the spike 20 and the backplane or tile electrical contact 32, 72.

In another embodiment of the present invention, the spikes 20 can include a soft metal and the backplane or tile electrical contacts 32, 72 include a high elastic modulus metal. In this arrangement, the spikes 20 can plastically deform and flow under mechanical pressure to provide a good electrical connection between the spikes 20 and the backplane or tile electrical contact 32, 72.

If an optional adhesive layer is formed on the destination substrate 30 or tile 70, the spikes 20 can be driven through the adhesive layer to form an electrical connection with the backplane or tile electrical contact 32, 72 beneath the adhesive layer. The adhesive layer can be cured to more firmly adhere the printable component structures 10 to the destination substrate 30 or tile 70 and maintain a robust electrical connection between the spikes 20 and the backplane electrical contact 32 or tile 70 in the presence of mechanical stress. The adhesive layer can undergo some shrinkage during the curing process that can further strengthen the electrical connectivity and adhesion between the spike 20 and the backplane or tile electrical contact 32, 72.

In alternative embodiments of the present invention, the spikes 20 of the printable component structures 10 are in contact with, are embedded in, or pierce the backplane or tile electrical contact 32, 72 of the destination substrate 30 or tile 70. In other, or additional, embodiments, either or both one or more of the spikes 20 and the backplane or tile electrical contact 32, 72 are deformed or crumpled into a non-planar shape or are deformed so that the surfaces of the spikes 20 and the backplane or tile electrical contact 32, 72 change shape on contact with each other. The deformation or crumpling can improve the electrical connection between the spikes 20 and the backplane or tile electrical contact 32, 72 by increasing the surface area that is in contact between the spikes 20 and the backplane or tile electrical contact 32, 72. To facilitate deformation, in an embodiment the spikes 20 have a composition softer than that of the backplane electrical contact 32 or the backplane electrical contact 32 have a composition softer the spikes 20.

As noted above with reference to FIG. 3, a multi-layer spike 20 can include a conductive spike layer 26 coated over a spike material 24. The conductive spike layer 26 can be a solder that is melted to promote the electrical connection between the spike 20 and the backplane or tile electrical contact 32, 72. In an alternative embodiment, the backplane or tile electrical contact 32, 72 include or are coated with a conductive material or solder. The spikes 20 can contact, be embedded in, or pierce the conductive spike layer 26. In some embodiments, the backplane or tile electrical contact 32, 72 has a first conductive layer and a second conductive layer over the first conductive layer, and the second conductive layer has a lower melting temperature than the first conductive layer. With a subsequent heat treatment, the solder can reflow and promote the electrical connection between the spike 20 and the backplane or tile electrical contact 32, 72. In yet another embodiment, both the spikes 20 and the backplane or tile electrical contact 32, 72 include a layer of conductive material such as solder or have a layer of conductive material other than the material making up the spikes 20 or backplane or tile electrical contact 32, 72 that electrically connects the backplane or tile electrical contact 32, 72 to the spikes 20. As noted above, a heat treatment can also serve to weld the backplane or tile electrical contact 32, 72 to the spike 20. Welding can be facilitated by providing a common material on the surfaces of the spikes 20 and the backplane or tile electrical contact 32, 72.

Printable component structures 10 can be small electronic integrated circuits, for example, having a size of about 5 microns to about 5000 microns in a dimension. The electronic circuits can include semiconductor materials (for example inorganic materials such as silicon or gallium arsenide, or inorganic materials) having various structures, including crystalline, microcrystalline, polycrystalline, or amorphous structures. In another embodiment, the printable component structures 10 are passive, for example including a conductor that, when used in a printed structure serves to electrically connect one conductor (e.g., a backplane electrical contact 32) to another, forming a jumper. The printable component structures 10 can also include insulating layers and structures such as silicon dioxide, nitride, and passivation layers and conductive layers or structures including wires made of aluminum, titanium, silver, or gold that foam an electronic circuit. Spikes 20 or component top or bottom electrical contact 12A, 12B can be formed of metals such as aluminum or polysilicon semiconductors and can be located on the top side 80 of the printable component structures 10. Methods and materials for making printable component structure 10 electronic circuits are used in the integrated circuit arts. Large numbers of such small integrated circuits are formed on a single source wafer. The printable component structures 10 are typically packed as closely as possible to use the surface area of the source wafer as efficiently as possible.

In some embodiments, the printable component structures 10 are small integrated circuits formed in a semiconductor wafer, for example gallium arsenide or silicon, which can have a crystalline structure. Processing technologies for these materials typically employ high heat and reactive chemicals. However, by employing transfer technologies that do not stress the printable component structure 10 or substrate materials, more benign environmental conditions can be used compared to thin-film manufacturing processes. Thus, the present invention has an advantage in that flexible substrates, such as polymeric substrates, that are intolerant of extreme processing conditions (e.g. heat, chemical, or mechanical processes) can be employed for the destination substrates 30. Furthermore, it has been demonstrated that crystalline silicon substrates have strong mechanical properties and, in small sizes, can be relatively flexible and tolerant of mechanical stress. This is particularly true for substrates having 5-micron, 10-micron, 20-micron, 50-micron, or even 100-micron thicknesses. Alternatively, the printable component structures 10 can be formed in a microcrystalline, polycrystalline, or amorphous semiconductor layer.

The printable component structures 10 can be constructed using foundry fabrication processes used in the art. Layers of materials can be used, including materials such as metals, oxides, nitrides and other materials used in the integrated-circuit art. Each printable component structure 10 can be a complete semiconductor integrated circuit and can include, for example, transistors. The printable component structures 10 can have different sizes, for example, 1000 square microns or 10,000 square microns, 100,000 square microns, or 1 square mm, or larger, and can have variable aspect ratios, for example 1:1, 2:1, 5:1, or 10:1. The printable component structures 10 can be rectangular or can have other shapes.

Embodiments of the present invention provide advantages over other printing methods described in the prior art. By employing connection posts on printable component structures 10 and a printing method that provides printable component structures 10 on a destination substrate 30 with the process side 40 and connection posts adjacent to the destination substrate 30, a low-cost method for printing chiplets in large quantities over a destination substrate 30 is provided. Furthermore, additional process steps for electrically connecting the printable component structures 10 to the destination substrate 30 are obviated.

The source wafer and printable component structures 10, stamp 60, and destination substrate 30 can be made separately and at different times or in different temporal orders or locations and provided in various process states.

The method of the present invention can be iteratively applied to a single or multiple destination substrates 30. By repeatedly transferring sub-arrays of printable component structures 10 from a source wafer to a destination substrate 30 with a stamp 60 and relatively moving the stamp 60 and destination substrates 30 between stamping operations by a distance equal to the spacing of the selected printable component structures 10 in the transferred sub-array between each transfer of printable component structures 10, an array of printable component structures 10 formed at a high density on a source wafer can be transferred to a destination substrate 30 at a much lower density. In practice, the source wafer is likely to be expensive, and forming printable component structures 10 with a high density on the source wafer will reduce the cost of the components 10, especially as compared to forming components on the destination substrate 30. Transferring the printable component structures 10 to a lower-density destination substrate 30 can be used, for example, if the printable component structures 10 manage elements distributed over the destination substrate 30, for example in a display, digital radiographic plate, or photovoltaic system.

In particular, in the case wherein the active printable component structure 10 is an integrated circuit formed in a crystalline semiconductor material, the integrated circuit substrate provides sufficient cohesion, strength, and flexibility that it can adhere to the destination substrate 30 without breaking as the transfer stamp 60 is removed.

In comparison to thin-film manufacturing methods, using densely populated source substrates wafers and transferring printable component structures 10 to a destination substrate 30 that requires only a sparse array of printable component structures 10 located thereon does not waste or require active layer material on a destination substrate 30. The present invention can also be used in transferring printable component structures 10 made with crystalline semiconductor materials that have higher performance than thin-film active components. Furthermore, the flatness, smoothness, chemical stability, and heat stability requirements for a destination substrate 30 used in embodiments of the present invention may be reduced because the adhesion and transfer process is not substantially limited by the material properties of the destination substrate 30. Manufacturing and material costs may be reduced because of high utilization rates of more expensive materials (e.g., the source substrate) and reduced material and processing requirements for the destination substrate 30.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer there between.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST

H height
W peak width
B base width
10 printable component structure
12A top electrical contact
12B bottom electrical contact
14 semiconductor structure
14A semiconductor layer
14B semiconductor layer
20 spike
20A short spike
24 spike material
26 conductive spike layer
28 bottom spike
30 destination substrate/backplane
32 backplane electrical contact
40 insulator
50 conductor
60 stamp
62 pillar
64 recess/stamp cavity
66 structured pillar surface 66A first portion
66B second portion
70 tile
72 tile electrical contact
80 top side
82 bottom side
90 etch mask
100 provide printable component structure step
102 provide stamp step
104 provide mold step
106 provide destination substrate step
110 contact components with stamp step
120 align components to destination substrate step
130 micro transfer print printable component structure to destination substrate step
140 dispose insulator on printable component structure step
150 optional etch insulator step
160 coat conductor on spike step
200 locate component in mold step
210 fill mold and cure stamp step
220 remove mold step
230 optional etch stamp step

The invention claimed is:

1. A micro-transfer printable component, comprising:
a semiconductor device with a top side and a bottom side, wherein the semiconductor device comprises an integrated circuit;
one or more top electrical contacts on the top side of the semiconductor device;
one or more bottom electrical contacts on the bottom side of the semiconductor device;
one or more electrically conductive bottom spikes disposed on and in electrical contact with the one or more bottom electrical contacts, wherein each of the one or more bottom spikes protrudes from one of the one or more bottom electrical contacts on the bottom side of the semiconductor device; and
one or more electrically conductive top spikes disposed on and in electrical contact with the one or more top electrical contacts, wherein each of the one or more top spikes protrudes from one of the one or more top electrical contacts on the top side of the semiconductor device and forms an exposed electrical contact.

2. The printable component of claim 1, wherein the semiconductor device is a multi-layer semiconductor device comprising sub-layers.

3. The printable component of claim 2, wherein the sub-layers comprise one or more members selected from the group consisting of one or more of a doped semiconductor layer, an n-doped semiconductor layer, and a p-doped semiconductor layer.

4. The printable component of claim 1, wherein at least one of (i) the one or more top spikes and (ii) the one or more bottom spikes are multi-layer spikes each comprising a spike material coated with an electrically conductive spike layer.

5. A micro-transfer printed structure, comprising:
a destination substrate and one or more backplane electrical contacts; and
one or more micro-transfer printed components, each of the one or more micro-transfer printed components comprising:
a semiconductor device with a top side and a bottom side, wherein the semiconductor device comprises an integrated circuit;
one or more top electrical contacts disposed on the top side of the semiconductor device;
one or more bottom electrical contacts exposed on the bottom side of the semiconductor device, wherein the one or more bottom electrical contacts are physically separate from the one or more top electrical contacts and electrically connected to the one or more top electrical contacts through the integrated circuit; and
one or more electrically conductive spikes disposed on, in electrical contact with, and protruding from the one or more top electrical contacts in a direction away from the destination substrate, forming an exposed electrical contact on a side of the micro-transfer printed component opposite the destination substrate,
wherein the backplane electrical contacts are electrically connected to the one or more bottom electrical contacts of each of the one or more micro-transfer printed components.

6. The printed structure of claim 5, wherein the one or more bottom electrical contacts comprises two or more bottom electrical contacts that are electrically connected to a common backplane electrical contact of the one or more backplane electrical contacts.

7. The printed structure of claim 5, wherein the one or more spikes are multi-layer spikes each comprising a spike material coated with an electrically conductive spike layer.

8. The printed structure of claim 5, comprising an insulator disposed over at least a portion of the destination substrate and at least a portion of the one or more micro-transfer printed components, wherein a portion of each of the one or more spikes is exposed.

9. The printed structure of claim 8, comprising a conductor disposed over at least a portion of the insulator and in electrical contact with the one or more spikes.

10. The printed structure of claim 9, comprising:
a plurality of printed components disposed on the destination substrate, each of the plurality of printed components comprising:
a semiconductor device with a top side and a bottom side, wherein the semiconductor device comprises an integrated circuit,
one or more top electrical contacts disposed on the top side of the semiconductor device,
one or more bottom electrical contacts exposed on the bottom side of the semiconductor device, wherein the one or more bottom electrical contacts are physically separate from the one or more top electrical contacts and electrically connected to the one or more top electrical contacts through the integrated circuit, and
one or more electrically conductive spikes disposed on, in electrical contact with, and protruding from the one or more top electrical contacts in a direction away from the destination substrate, forming an exposed electrical contact on a side of the printed component opposite the destination substrate;
an insulator disposed over at least a portion of each of the plurality of printed components on a side of the printed components opposite the destination substrate, wherein a portion of each of the spikes of the plurality of printed components is exposed;
and the conductor in electrical contact with each of the spikes of the plurality of printed components.

11. The printed structure of claim 5, comprising one or more electrically conductive bottom spikes in electrical contact with the one or more bottom electrical contacts, wherein each bottom spike protrudes from a bottom electrical contact on the bottom side of the semiconductor device and is electrically connected to one of the bottom electrical contacts.

12. A method of making a micro-transfer printed structure, comprising:
providing one or more micro-transfer printable component structures on a source substrate, each of the one or more micro-transfer printable component structures comprises:
a semiconductor device with a top side and a bottom side, wherein the semiconductor device comprises an integrated circuit,
one or more top electrical contacts disposed on the top side of the semiconductor device,
one or more bottom electrical contacts exposed on the bottom side of the semiconductor device, the one or more bottom electrical contacts are physically separate from the one or more top electrical contacts and electrically connected to the one or more top electrical contacts through the integrated circuit, and
one or more electrically conductive spikes disposed on, in electrical contact with, and protruding from the one or more top electrical contacts in a direction away from the source substrate, forming an exposed electrical contact on a side of the micro-transfer printable component opposite the source substrate;
providing a destination substrate having one or more backplane electrical contacts;
micro transfer printing the one or more micro-transfer printable component structures from the source substrate onto the destination substrate;
disposing an insulator over at least a portion of each of the one or more micro-transfer printable component structures; and
disposing a conductor over at least a portion of the insulator and over at least a portion of the one or more spikes of each of the one or more micro-transfer printable components so that the conductor is in electrical contact with the one or more spikes of each of the one or more micro-transfer printable component structures.

13. The method of claim 12, wherein the one or more spikes protrudes from the insulator after the insulator is disposed over at least a portion of each of the one or more printable component structures.

14. The method of claim 12, wherein the step of micro-transfer printing comprises:
providing a stamp comprising one or more pillars;
contacting the stamp to the source wafer, wherein the one or more pillars of the stamp are displaced when placed in contact with the one or more spikes of the printable component structure on the source wafer; and
removing the stamp from the source wafer to release and align the printable component structure.

15. The method of claim 12, comprising:
coating at least a portion of the one or more micro-transfer printable component structures and the one or more electrically conductive spikes of each of the one or more micro-transfer printable component structures with an insulator on a side of the micro-transfer printable component structure opposite the source substrate; and
blanket etching the insulator to expose the one or more spikes.

16. The method of claim 15, wherein the coating step occurs after the micro transfer printing step.

* * * * *